US009013021B2

(12) United States Patent
Van Duren et al.

(10) Patent No.: US 9,013,021 B2
(45) Date of Patent: Apr. 21, 2015

(54) OPTICAL ABSORBERS

(71) Applicant: Intermolecular, Inc., San Jose, CA (US)

(72) Inventors: Jeroen Van Duren, Palo Alto, CA (US);
Haifan Liang, Fremont, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/034,226

(22) Filed: Sep. 23, 2013

(65) Prior Publication Data
US 2014/0264708 A1     Sep. 18, 2014

Related U.S. Application Data

(60) Provisional application No. 61/783,021, filed on Mar. 14, 2013.

(51) Int. Cl.
*H01L 31/102* (2006.01)
*H01L 31/00* (2006.01)
*H01L 31/18* (2006.01)
*H01L 31/065* (2012.01)

(52) U.S. Cl.
CPC .............. *H01L 31/18* (2013.01); *H01L 31/065* (2013.01)

(58) Field of Classification Search
CPC ................................ H01L 31/18; H01L 31/065
USPC ................................ 257/458; 136/255; 438/19
See application file for complete search history.

(56) References Cited

U.S. PATENT DOCUMENTS

| | | | |
|---|---|---|---|
| 6,974,976 B2 * | 12/2005 | Hollars | 257/184 |
| 8,664,033 B2 * | 3/2014 | Liang | 438/84 |
| 8,748,216 B2 * | 6/2014 | Guo et al. | 438/88 |
| 2011/0279141 A1 | 11/2011 | Wang et al. | |
| 2011/0279810 A1 | 11/2011 | Wang et al. | |
| 2012/0100660 A1 * | 4/2012 | Hagedorn et al. | 438/63 |
| 2012/0196399 A1 | 8/2012 | Ding et al. | |
| 2013/0040420 A1 * | 2/2013 | Bollman et al. | 438/95 |
| 2013/0210191 A1 * | 8/2013 | Van Duren et al. | 438/95 |
| 2014/0099748 A1 * | 4/2014 | Woods et al. | 438/94 |
| 2014/0158190 A1 * | 6/2014 | Liang et al. | 136/255 |

FOREIGN PATENT DOCUMENTS

WO     2011140115 A1     11/2011

OTHER PUBLICATIONS

Wang, Q., et al.; Combinatorial Approach to Thin-Film Silicon Materials and Devices; Apr. 2003; National Renewable Energy Laboratory; Conference Paper; 15 pages.
Mitzi, D., et al.; The Path Towards a High-Performance Solution-Processed Kesterite Solar Cell; Jan. 17, 2011; Elsevier B.V.; Solar Energy Materials & Solar Cells; pp. 1421-1436.

(Continued)

*Primary Examiner* — William D Coleman

(57) ABSTRACT

Optical absorbers, solar cells comprising the absorbers, and methods for making the absorbers are disclosed. The optical absorber comprises a semiconductor layer having a bandgap of between about 1.0 eV and about 1.6 eV disposed on a substrate, wherein the semiconductor comprises two or more earth abundant elements. The bandgap of the optical absorber is graded through the thickness of the layer by partial substitution of at least one grading element from the same group in the periodic table as the at least one of the two or more earth abundant elements.

9 Claims, 14 Drawing Sheets

(56) References Cited

OTHER PUBLICATIONS

Tiwari, D, et al.; Direct Liquid Coated Cu2SnS3 as a New Absorber Material for Thin Film Photovoltaics; IEEE; 38th IEEE PVSC; 3 pages, 2012.

Berg, D., et al.; Thin Film Solar Cells Based on the Ternary Compound Cu2SnS3; Jun. 7, 2012; Elsevier B.V.; Thin Solid Films; pp. 6291-6294.

Bouaziz, M., et al.; Growth of Cu2SnS3 Thin Films by Solid Reaction Under Sulphur Atmosphere; 2011; Elsevier Ltd.; Vacuum; pp. 783-786, Feb. 1, 2011.

Fernandes, P., et al.; A study of ternary Cu2SnS3 and Cu3SnS4 thin films prepared by sulfurizing stacked metal precursors; 2010; Journal of Physics D: Applied Physics; 1 page.

* cited by examiner

OPTICAL ABSORBERS

CROSS-REFERENCE TO RELATED APPLICATIONS

This application claims priority to U.S. Provisional Application No. 61/783,021, filed on Mar. 14, 2013, which is herein incorporated by reference for all purposes. This application is related to U.S. patent application Ser. No. 13/596,387 filed on Aug. 28, 2012, which is a Continuation-in-Part of U.S. patent application Ser. No. 13/595,888 filed on Aug. 27, 2012, which further claims priority to U.S. Provisional Patent Application Ser. No. 61/578,691 filed on Dec. 21, 2011, each of which are herein incorporated by reference for all purposes.

FIELD OF THE INVENTION

One or more embodiments of the present invention relate to methods of manufacture of optical absorbers suitable for use in solar cells.

BACKGROUND

The increasing demand for environmentally friendly, sustainable and renewable energy sources is driving the development of large area, thin film photovoltaic (TFPV) devices. With a long-term goal of providing a significant percentage of global energy demand, there is a concomitant need for Earth-abundant, high conversion efficiency materials for use in photovoltaic devices. The categorization of earth abundant elements can be described in various ways, for example, by crustal abundance, relative annual commercial production, or price. For example, by crustal abundance, the top 30 elements are O, Si, Al, Fe, Ca, Mg, Na, K, Ti, C, H, Mn, P, F, S, Sr, Ba, V, Cl, Cr, Zr, Ni, Zn, Cu, Rb, Ce, La, Nd, Co, Y. See, e.g., Alharbi, F., et al. "Abundant non-toxic materials for thin film solar cells: Alternative to conventional materials" 2011 Renewable Energy 36, Issue 10, October 2011, Pages 2753-2758. (O and N are available from the atmosphere.) A number of Earth abundant, direct-bandgap semiconductor materials now seem to show evidence of the potential for both high efficiency and low cost in Very Large Scale (VLS) production (e.g., greater than 100 GW), yet their development and characterization remains difficult because of the complexity of the materials systems involved.

Among the TFPV technologies, $CuIn_xGa_{1-x}Se_2$ (CIGS) and CdTe are the two that have reached volume production with greater than 11% stabilized module efficiencies. However, the supply of In, Ga and Te may impact annual production of CIGS and CdTe solar panels. Moreover, price increases and supply constraints in Ga and In could result from the aggregate demand for these materials used in flat panel displays (FPDs) and light-emitting diodes (LEDs) along with CIGS TFPV. Also, there are concerns about the toxicity of Cd throughout the lifecycle of the CdTe TFPV solar modules. Efforts to develop devices that leverage manufacturing and R&D infrastructure related to these TFPV technologies but using more widely available and more environmentally friendly materials should be considered a top priority for research. The knowledge and infrastructure developed around CdTe and CIGS TFPV technologies can be leveraged to allow faster adoption of new TFPV materials systems.

Optical absorbers for use with solar cells are more economically attractive if they have high efficiency and can be made from earth-abundant materials that are available at low cost. CZTS absorbers are being widely studied to meet these performance goals. CZTS has a strong absorption coefficient for visible light making it possible to use thinner absorber layers further reducing costs of assembled solar cells. CZTS is comprised of Cu, Zn, Sn, and Se. In both CIGS and CZTS materials, S can be substituted for some or all of the Se.

It is also possible to make similar absorbers using various other combinations of earth-abundant materials, but these have not yet been developed as extensively, and their performance potential is not yet known. One such example material is $Fe_2(Si,Ge)(S,Se)_4$ which is described in commonly owned, co-pending U.S. patent application Ser. No. 13/727,986, incorporated herein by reference. Another material that has been described is $Cu_2SnS_3$ for which some preliminary studies have been reported by Devendra et al. ("Direct Liquid-Coated $Cu_2SnS_3$ as a New Absorber Material for Thin-Film Solar Cell," $38^{th}$ IEEE PVSC, 2012), Berg, et al. ("Thin film solar cells based on the ternary compound $Cu_2SnS_3$," Thin Solid Films, 520, 6291-94, 2012), Bouaziz et al. ("Growth of $Cu_2SnS_3$ thin films by solid reaction under sulphur atmosphere," Vacuum, 85, 783-86, 2011), and Fernandes et al. ("A study of ternary $Cu_2SnS_3$ and $Cu_3SnS_4$ thin films prepared by sulfurizing stacked metal precursors," J. Phys. D: Appl. Phys., 43, 215403, 2010). The use of $Zn_3P_2$ as a solar cell absorber has been described in U.S. Pat. Nos. 4,342,879 and 4,477,688, and power conversion efficiencies of 4-6% have been reached. In addition, $BaSi_2$ is a semiconductor with a bandgap of 1.4 eV, the use of which as a solar absorber has been described in U.S. Patent Application Publication Nos. 2010/0252097 and 2012/0049150.

The development of TFPV devices exploiting Earth abundant materials represents a daunting challenge in terms of the time-to-commercialization. That same development also suggests an enticing opportunity for breakthrough discoveries. A quaternary system such as CIGS requires management of multiple kinetic pathways, thermodynamic phase equilibrium considerations, defect chemistries, and interfacial control. The vast phase-space to be managed includes process parameters, source material choices, compositions, and overall integration schemes. The complexity of the intrinsically-doped, self-compensating, multinary, polycrystalline, queue-time-sensitive, thin-film absorber (CIGS), and its interfaces to up-, and down-stream processing, combined with the lack of knowledge on a device level to address efficiency losses effectively, makes it a highly empirical material system. The performance of any thin-film, (opto-)electronically-active device is extremely sensitive to its interfaces, especially when contacting dissimilar materials where at least one of the materials is a multinary compound semiconductor. Interface engineering for electronically-active devices is highly empirical. Traditional R&D methods are ill-equipped to address such complexity, and the traditionally slow pace of R&D could limit any new material from reaching industrial relevance when having to compete with the incrementally improving performance of already established TFPV fabrication lines, and continuously decreasing panel prices for more traditional cSi PV technologies.

Due to the complexity of the material, cell structure, and manufacturing process, both a complete fundamental scientific understanding and large scale manufacturability are yet to be realized for TFPV devices. As the photovoltaic industry pushes to achieve grid parity, much faster and broader investigation is needed to explore the material, device, and process windows for higher efficiency and a lower cost of manufacturing process. Efficient methods for forming different types of TFPV devices that can be evaluated are necessary.

SUMMARY OF THE INVENTION

Optical absorbers, solar cells comprising the optical absorbers, and methods for making the absorbers are disclosed. The optical absorber comprises a semiconductor layer having a thickness and having a bandgap of between about 1.0 eV and about 1.6 eV disposed on a substrate, wherein the semiconductor comprises a compound of two or more earth abundant elements. The earth abundant elements comprise O, Si, Al, Fe, Ca, Mg, Na, K, Ti, C, Mn, P, F, S, Sr, Ba, V, Cl, Cr, Zr, Ni, Zn, Cu, N, Sn, Mo, and W. The optical absorber is operable to form photoelectrons from impinging photons.

The bandgap of the optical absorber is graded through the thickness of the layer by partial substitution of at least one grading element from the same group in the periodic table as the at least one of the two or more earth abundant elements. The grading element comprises one or more of O, Si, Al, Fe, Ca, Mg, Na, K, Ti, C, Mn, P, F, S, Sr, Ba, V, Cl, Cr, Zr, Ni, Zn, Cu, N, Sn, Mo, W, Se, Ge, and Ag. In some embodiments, the bandgap is single-graded through the thickness of the layer. In some embodiments, the bandgap is double-graded through the thickness of the layer. In some embodiments, the bandgap is graded continuously through the thickness of the layer.

In some embodiments, the semiconductor comprises Cu, Sn and S, e.g., $Cu_2SnS_3$. In some embodiments, the semiconductor comprises Cu, Sn, Zn and S, e.g., $Cu_2ZnSnS_4$. For example, the semiconductor can be $Cu_2SnS_3$ or $Cu_2ZnSnS_4$, and the at least one grading element comprises one or more of Ag, Si, Ge, Pb or Se. In some embodiments, the semiconductor comprises W and S, e.g., $WS_2$. For example, the semiconductor can be $WS_2$, and the at least one grading element comprises one or more of Mo, Cr or Se. In some embodiments, the semiconductor comprises Ba and Si, e.g., $BaSi_2$. For example, the semiconductor can be $BaSi_2$, and the at least one grading element comprises one or more of Mg, Ca, Sr, Ge, Pb, or Sn. In some embodiments, the semiconductor comprises Ca and N, e.g., $Ca_3N_2$. For example, the semiconductor can be $Ca_3N_2$, and the at least one grading element comprises one or more of Mg, Sr, Ba or P. In some embodiments, the semiconductor comprises Zn and P, e.g., $Zn_3P_2$. For example, the semiconductor can be $Zn_3P_2$, and the at least one grading element comprises N.

In additional embodiments, methods are disclosed for forming an optical absorber comprising forming a first layer having a thickness and comprising a semiconductor having a bandgap of between about 1.0 eV and about 1.6 eV on a substrate, and grading the bandgap through the thickness of the layer. The semiconductor comprises two or more earth abundant elements, and the bandgap grading is performed by partially substituting at least one grading element for at least one of the two or more earth abundant elements, wherein the grading element is from the same group in the periodic table as the at least one of the two or more earth abundant elements. The earth abundant elements comprise one or more of O, Si, Al, Fe, Ca, Mg, Na, K, Ti, C, Mn, P, F, S, Sr, Ba, V, Cl, Cr, Zr, Ni, Zn, Cu, N, Sn, Mo, and W. The at least one grading element comprises one or more of O, Si, Al, Fe, Ca, Mg, Na, K, Ti, C, Mn, P, F, S, Sr, Ba, V, Cl, Cr, Zr, Ni, Zn, Cu, N, Sn, Mo, W, Se, Ge, Pb, and Ag. The grading the bandgap comprises forming a second layer above the first layer, wherein the second layer comprises the same semiconductor as the first layer, and wherein the first layer has a different amount of the at least one grading element than the second layer. Usually the layers will be in direct physical contact with one another. The methods can further comprise annealing the first and second layers. In some embodiments, the grading the bandgap provides an absorber layer that is single-graded through the thickness of the layer. In some embodiments, the grading the bandgap provides an absorber layer that is double-graded through the thickness of the layer. In some embodiments, grading the bandgap provides an absorber layer that is continuously graded through the thickness of the layer.

In some embodiments, forming the first layer can comprise forming a precursor film comprising one or more earth abundant elements on a substrate, and converting the precursor film to a semiconductor. For example, a metal precursor film can be formed followed by sulfurization, selenization, nitridization, silicidization, phosphidization, and the like.

In some embodiments, methods of forming an optical absorber comprise designating a plurality of discrete site-isolated regions (SIRs) on a substrate, forming a semiconductor layer on the SIRs on the substrate, wherein the semiconductor comprises a compound of two or more earth abundant elements, and wherein one or more process parameters for forming the layer on the plurality of SIRs are varied in a combinatorial manner, and characterizing each semiconductor layer formed on the discrete SIRs. The semiconductor layer can be formed as one or more layers, and can be formed as a precursor metal layer followed by an additional earth abundant element to form a semiconductor absorber layer.

In some embodiments, the relative amounts of the two or more earth abundant elements and the at least one grading element are varied in a combinatorial manner among a plurality of discrete site-isolated regions (SIRs) designated on the substrate. The semiconductor layer can be formed by one or more of PVD, CVD, PECVD, ALD, electroplating, wet coating methods, molecular beam epitaxy, thermal evaporation, and electron beam deposition. The process parameters include process material amounts, reactant species, processing temperatures, processing times, ramp rates, cool-down rates, processing pressures, processing flow rates, processing powers, processing reagent compositions, the rates at which the reactions are quenched, atmospheres in which the processes are conducted, and order in which materials are deposited.

The characterizing the semiconductor layer comprises measuring a structure or performance parameter for each of the plurality of site-isolated regions wherein the structure or performance parameter is one or more of crystallinity, grain size (distribution), lattice parameter, crystal orientation (distribution), matrix and minority composition, bandgap, bandgap grading, bulk bandgap, surface bandgap, efficiency, resistivity, carrier concentration, mobility, minority carrier lifetime, optical absorption coefficient, surface roughness, adhesion, thermal expansion coefficient, thickness, photoluminescence properties, surface photovoltage properties, haze, gloss, specular reflection, etc.

In some embodiments, solar cells are provided comprising an optical absorber comprising one or more earth abundant elements. The optical absorbers in the solar cells can be prepared according to the methods described herein.

DETAILED DESCRIPTION

Figure 1:
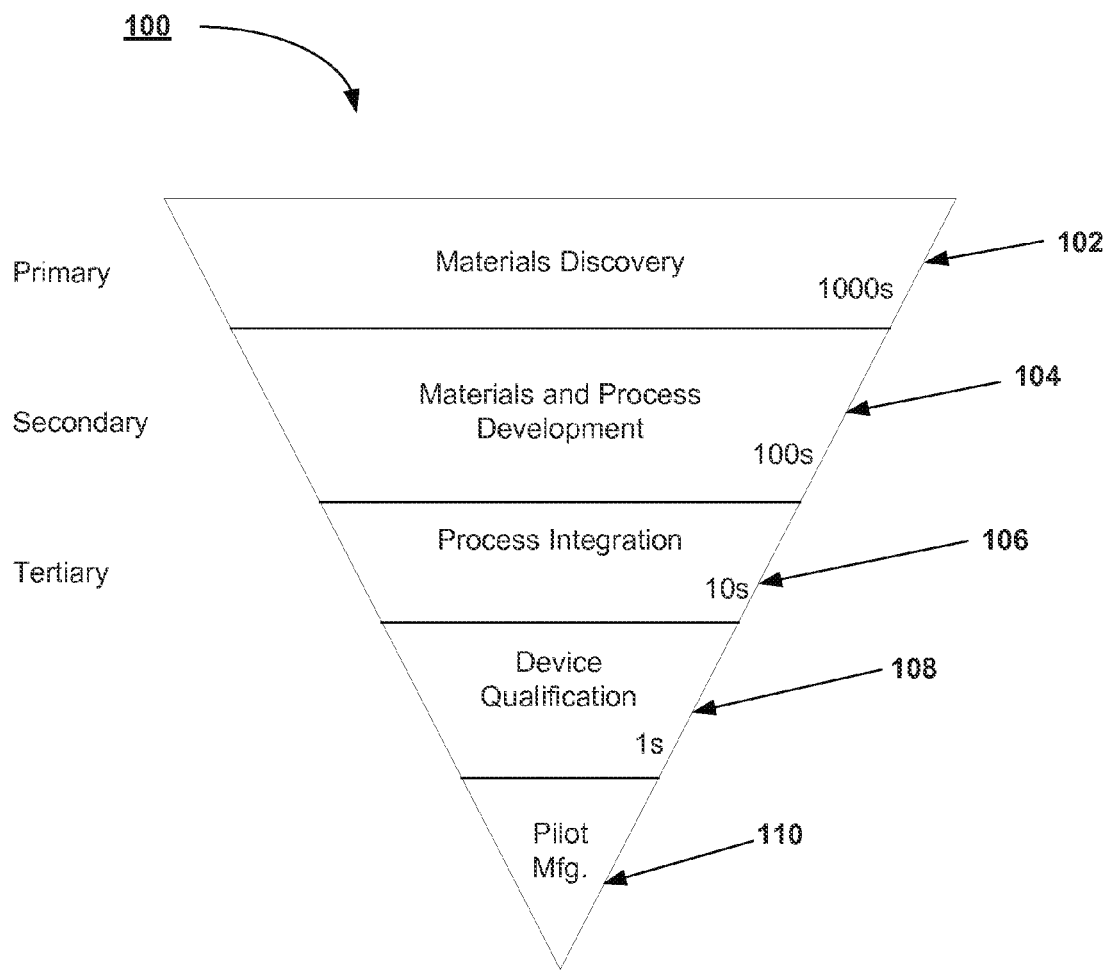
FIG. 1 is a schematic diagram for implementing combinatorial processing and evaluation.

Before the present invention is described in detail, it is to be understood that unless otherwise indicated this invention is not limited to specific semiconductor devices or to specific semiconductor materials. Exemplary embodiments will be described for solar cells, but other devices can also be fabricated using the methods disclosed. It is also to be understood that the terminology used herein is for the purpose of describing particular embodiments only and is not intended to limit the scope of the present invention.

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" or "approximately" is used, the stated quantity can vary by up to 10%. Where the modifier "substantially equal to" is used, the two quantities may vary from each other by no more than 5%.

Definitions:

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

As used herein, "CIGS" will be understood to represent the entire range of related alloys denoted by $Cu_zIn_{(1-x)}Ga_x S_{(2+w)(1-y)}Se_{(2+w)y}$, where $0.5 \leq z \leq 1.5$, $0 \leq x \leq 1$, $0 \leq y \leq 1$, $-0.2 \leq w \leq 0.5$. Similarly, as noted above, other materials (i.e. Ag, Au, Te, etc.) may be incorporated into potential absorber layers, (with e.g. Ag replacing part or all of the Cu, and Te replacing part or all of the Se and/or S). Also as mentioned previously, any of these materials may be further doped with a suitable dopant. As used herein, "CIGSSe", "CIGSe", and "CIGS" will be defined as equivalent and will be used interchangeably and will include all compositions including Cu—In—Ga—Se—S, Cu—In—Ga—Se, and Cu—In—Ga—S. Furthermore, "CIGS" also includes other IB-IIIA-VIA alloys, like (Ag,Cu)(In,Ga)(Se), or (Cu)(In,Ga)(S,Se,Te), and the like.

As used herein, "CZTS" will be understood to represent the entire range of related alloys denoted by $Cu_xZn_ySn_z S_{(4+w)(1-u)}Se_{(4+w)u}$ where $1.5 \leq x \leq 2.5$, $0.8 \leq y \leq 1.2$, $0.8 \leq z \leq 1.2$, $0 \leq u \leq 1$, $-0.2 \leq w \leq 0.5$. Similarly, as noted above, other materials (i.e. Ag, Au, Te, Si, Ge, etc.) may be incorporated into potential absorber layers, (with e.g., Ag replacing part or all of the Cu, and Te replacing part or all of the Se and/or S). Also as mentioned previously, any of these materials may be further doped with a suitable dopant.

As used herein, "CZTSSe", "CZTSe", and "CZTS" will be defined as equivalent and will be used interchangeably and will include all compositions including Cu—Zn—Sn—Se—S, Cu—Zn—Sn—Se, and Cu—Zn—Sn—S. Furthermore, "CZTS" also includes other IB-IIB-IVA-VIA alloys, like (Ag,Cu)Zn(Si,Ge,Sn,Pb)(Se), or (Cu)Zn(Sn,Ge)(S,Se,Te), and the like. Similar definitions apply for the compounds $WS_2$, $BaSi_2$, $Zn_3P_2$, $Ca_3N_2$, and their respective alloys, like VIB-VIA for $(Mo,W)(S,Se)_2$, etc.

As used herein, the notation "(IIIA)" will be understood to represent the sum of the concentrations of all Group-IIIA elements. This notation will be used herein in calculations of the composition ratios of various elements. This notation will be understood to extend to each of the other Groups of the periodic table respectively (e.g. "(IA)", "(IIA)", "(IVA)", "(VIA)", "(IB)", "(IIB)", etc.).

As used herein, the notation "Cu—Zn—Sn" and "Cu(Zn, Sn)" will be understood to include a material containing these elements in any ratio. The notation is extendable to other materials and other elemental combinations.

As used herein, the notation "$Cu_xZn_ySn_z$" will be understood to include a material containing these elements in a specific ratio given by x, y, and z (e.g., $Cu_{75}Ga_{25}$ contains 75 atomic % Cu and 25 atomic % Ga). The notation is extendable to other materials and other elemental combinations.

As used herein, the notation "$(Ag,Cu)_x(In,Ga)_y(Se,S,Te)_z$" will be understood to include a material containing a total amount of Group-IB elements (i.e. Ag plus Cu, etc.) in a ratio given by x, a total amount of Group-IIIA elements (i.e. In plus Ga), etc. in a ratio given by y, and a total amount of Group-VIA elements (i.e. Se plus S plus Te, etc.) in a ratio given by z. The notation is extendable to other materials and other elemental combinations.

As used herein, "metal chalcogenide" or "chalcogenide" will be understood to represent the entire range of related compounds denoted by "MX" where M represents one or more metal elements and X represents one or more of the chalcogen elements (e.g., O, S, Se, or Te). The same holds for "metal silicide" where "metal silicide" will be understood to represent the entire range of related compounds denoted by "MSi" where M represents one or more metal elements. This can be further extended to other compounds.

As used herein, "chalcogenize" and "chalcogenization" will be understood to represent the process by which one or more metals are converted to chalcogenide compounds by exposing the one or more metals to a chalcogen (e.g., O, S, Se, or Te) at elevated temperature (e.g. between 100° C. and 700° C.). Specifically, "selenization" will be understood to represent the process by which one or more metals are converted to selenide compounds by exposing the one or more metals to a Se source at elevated temperature (e.g., between 100° C. and 700° C.). Specifically, "sulfurization" will be understood to represent the process by which one or more metals are converted to sulfide compounds by exposing the one or more metals to a S source at elevated temperature (e.g., between 100° C. and 700° C.). In addition, "chalcogenize" or "chalcogenization" will be understood to represent the process by which a metal precursor is either partially or completely converted to the final multinary chalcogenide compound(s). Similarly, "chalcogenize" or "chalcogenization" will be understood to represent the process by which a precursor containing one or more chalcogenide materials with/without one or more elemental or alloy metals is converted to one or more dense, polycrystalline, desired multinary chalcogenide compound(s). It should be understood that the majority of the final film contains the desired multinary chalcogenide compound(s), yet a minority of the material might not be converted to the desired multinary chalcogenide compound(s). It should be understood that "chalcogenization" does not apply to the conversion of precursor films in a reactive atmosphere based on sources of Si, N, and/or P. Nevertheless, the processing sequence, methods, and concepts as described for "chalcogenization" broadly apply to the conversion in a reactive atmosphere based on sources of Si, N, and/or P.

As used herein, the term "earth-abundant elements" refer to elements that are relatively abundant in the Earth's crust. As used herein, these earth abundant elements include O, Si, Al, Fe, Ca, Mg, Na, K, Ti, C, Mn, P, F, S, Sr, Ba, V, Cl, Cr, Zr, Ni, Zn, Cu, N, Sn, Mo, and W. Optical absorbers include semiconducting materials made from these elements. The bandgap of an absorber layer formed using these earth abundant elements can be tuned or graded using one or more "grading elements," wherein the grading element is from the same group in the periodic table as the earth abundant elements. Suitable grading or tuning elements include elements such as O, Si, Al, Fe, Ca, Mg, Na, K, Ti, C, Mn, P, F, S, Sr, Ba, V, Cd, Cl, Cr, Hg, Zr, Ni, Zn, Cu, N, Sn, Mo, W, Se, Ge, Pb, As, and Ag.

As used herein, the term "non-toxic elements" refers to elements that are not included in the National Institute for Occupational Health and Safety's list of materials that are Immediately Dangerous to Life or Health (IDLH). Elements that are not non-toxic are those considered IDLH in concentrations above 100 mg/m$^3$. Elements deemed to be IDLH can include Se, Rh, Pt, Be, As, Cd, Hg, Ni, Ag, U, Tl, Co, Cr, Te, Zr, V, Sb, Ba, Hf Where utilized in embodiments herein, these elements are preferably present only in amounts below their respective IDLH amounts. For example, for Se, optical absorbers used herein preferably incorporate Se at concentrations no greater than 1 mg/m$^3$. It will be understood by those of skill in the art however that Se compounds that are encapsulated within an optical absorber layer of a solar cell are not readily accessible to the environment, and therefore can be used without risk of exposure except during manufacturing and recycling stages of device life cycle, where safety precautions may be necessary. Similarly, Ag dust and soluble compounds are toxic at levels exceeding 10 mg/m$^3$; however Ag compounds encapsulated within an optical absorber layer of a solar cell are inaccessible to the environment, and therefore can be used without risk of exposure except during manufacturing and recycling stages of device life cycle, where safety precautions may be necessary.

As used herein, the terms "film" and "layer" will be understood to represent a portion of a stack. They will be understood to cover both a single layer as well as a multilayered structure (i.e. a nanolaminate). As used herein, these terms will be used synonymously and will be considered equivalent.

As used herein, the term "front electrode" refers to the electrode on the side of the absorber layer facing the incoming light. As used herein, the term "front contact layer" refers to the layer on the side of the absorber layer facing the incoming light. As used herein, the phrase "front contact" will be understood to be the primary current conductor layer situated between the substrate and the buffer layer in a superstrate configuration TFPV device, and is synonymous with the front electrode.

As used herein, the term "back electrode" refers to the electrode on the side of the absorber layer facing away from the incoming light. As used herein, the term "back contact layer" refers to the layer on the side of the absorber layer facing away from the incoming light. As used herein, the phrase "back contact" will be understood to be the primary current conductor layer situated between the substrate and the absorber layer in a substrate configuration TFPV device, and is synonymous with the back electrode. In some embodiments, the back contact layer can be textured so as to provide a textured surface for enhanced light absorption.

As used herein, "single grading" and "single gradient" will be understood to describe cases wherein a parameter varies throughout the thickness of a film or layer (as opposed to lateral nonuniformity) and further exhibits a smooth, quasi-linear variation. Examples of suitable parameters used herein will include the atomic concentration of a specific elemental species (i.e. composition variation) throughout the thickness of a film or layer, and bandgap energy variation throughout the thickness of a film or layer.

As used herein, "double grading" and "double gradient" will be understood to describe cases wherein a parameter varies throughout the thickness of a film or layer and further exhibits a variation wherein the value of the parameter is smaller toward the middle of the film or layer with respect to either end of the film or layer. It is not a requirement that the value of the parameter be equivalent at the two ends of the film or layer. Examples of suitable parameters used herein will include the atomic concentration of a specific elemental species (i.e. composition variation) throughout the thickness of a film or layer, and bandgap energy variation throughout the thickness of a film or layer.

As used herein, the term "stoichiometric compound" or "stoichiometric atomic ratio" refers to a compound in which the ratio of the number of atoms to each other is a ratio of small whole numbers.

As used herein, "substrate configuration" will be understood to describe cases wherein the TFPV stack is built sequentially on top of a substrate and the light is assumed to be incident upon the top of the TFPV stack. As used herein, an "n-substrate" configuration will be used to denote that the n-type layer (i.e. buffer layer) is closest to the incident light. The n-substrate configuration is the most common. As used herein, a "p-substrate" configuration will be used to denote that the p-type layer (i.e. absorber layer) is closest to the incident light.

As used herein, "superstrate configuration" will be understood to describe cases wherein the substrate faces the incident sunlight. The convention will be used wherein light is assumed to be incident upon the substrate. As used herein, an "n-superstrate" configuration will be used to denote that the n-type layer (i.e. buffer layer) is closest to the incident light. As used herein, a "p-superstrate" configuration will be used to denote that the p-type layer (i.e. absorber layer) is closest to the incident light.

As used herein, "substrate" will be understood to generally be one of float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, in-line continuous processing, roll-to-roll processing, etc. in all of the methods and examples described herein. A substrate can optionally include coatings (e.g., a diffusion barrier and a back electrode) already deposited on the substrate prior to the deposition of an absorber layer.

As used herein, "precursor layer," "precursor material," "metal precursor layer," "metal precursor material," "precursor film," etc. will be understood to be equivalent and be understood to refer to a metal, metal alloy, metal chalcogenide, metal silicide, metal phosphide, metal nitride, etc. layer and/or material that is first deposited and will ultimately become the absorber layer of the TFPV device after full conversion in a reactive atmosphere and/or further processing.

As used herein, "optical absorber," "absorber layer," "absorber material," "absorber film," etc. will be understood to be equivalent and be understood to refer to a layer and/or material that is responsible for the charge generation in the TFPV device after full chalcogenization and/or further processing to prepare the semiconductor material.

As used herein, the notations "Al:ZnO" and "ZnO:Al" will be understood to be equivalent and will describe a material wherein the base material is the metal oxide and the element separated by the colon, ":", is considered a dopant. In this example, Al is a dopant in a base material of zinc oxide. The notation is extendable to other materials and other elemental combinations.

As used herein, a "bandgap-increasing metal" will be understood to be a metal element that increases the bandgap when substituted for an element from the same periodic table Group in the absorber material. For example, substituting Ag for a portion of the Cu in a CIGS material will increase the bandgap. For example, increasing the relative amount of Ga versus indium in a CIGS material will increase the bandgap. For example, substituting Ag for a portion of the Cu in a CZTS material will increase the bandgap. For example, substituting Ge for a portion of the Sn in a CZTS material will increase the bandgap.

The bandgap value represents the energy difference between the top of the valence band and the bottom of the conduction band in the absorber layer at the same depth in the absorber layer. In FIGS. 8-11, the bandgap diagrams are included to aid the reader in visualizing the relative magnitude of the bandgap across the absorber layer. No inferences should be made with respect to absolute values or actual changes in either the valance band or conduction band values. The diagrams are for visualization purposes only. In various figures below, a TFPV material stack is illustrated using a simple planar structure. Those skilled in the art will appreciate that the description and teachings to follow can be readily applied to any simple or complex TFPV solar cell structure, (e.g. a stack with (non-conformal) non-planar layers for optimized photon management). The drawings are for illustrative purposes only and do not limit the application of the present invention.

"Double grading" the bandgap of the CIGS absorber is a method known in the art to increase the efficiency of CIGS or CIGS-like solar cells. In a CIGS absorber layer that has a double-graded bandgap profile, the bandgap of the CIGS layer increases toward the front surface and toward the CIGS surface of the CIGS layer, with a bandgap minimum located in a center region of the CIGS layer. Double grading helps in reducing unwanted charge carrier recombination. The increasing bandgap profile at the back surface of the CIGS layer, (i.e., the absorber surface that is remote from the incident light in the substrate configuration), creates a back surface field, which reduces recombination at the back surface and enhances carrier collection. This approach can be applied to CZTS absorbers as well. Generally, in the disclosure to follow, the description will apply to the "n-substrate" configuration for economy of language. However, those skilled in the art will understand that the disclosure is also equally applicable to either of the "p-substrate" or "n, p-superstrate" configurations discussed previously.

Co-evaporation is one technique known in the art for producing a double-graded bandgap in a CIGS absorber layer. The co-evaporation process can produce a "gallium (Ga) rich region" (i.e. increased Ga relative to the center region of the layer) at the front and/or back surfaces of a CIGS absorber layer and a gallium-poor region in the center of the CIGS absorber layer. However, co-evaporation is a relatively complex process that is not as economical or as easily implemented as other deposition processes known in the art. In a 2-step process, Cu—In—Ga metal precursors are deposited first, followed by a second selenization process to form a CIGS absorber layer. The 2-step process is generally more suited to large-scale low-cost manufacturing compared to the co-evaporation process. However, because gallium selenizes slower than indium under otherwise identical conditions, gallium tends to accumulate towards the back surface of the CIGS layer during the selenization process, thereby creating an uncontrolled single grading in the bandgap profile, i.e., the bandgap of the CIGS layer increases from the front surface to the back surface. Double grading of the bandgap profile is then typically achieved by the incorporation of sulfur (S) at the front surface of the CIGS layer for a 2-step process thereby creating CIGSSe. However, sulfur incorporation adds considerable complexity to the growth process and more easily produces a TFPV absorber material (copper-indium-gallium-selenium-sulfur) of lower quality compared to CIGSe without sulfur.

Similarly, co-evaporation can be used to produce absorber layers using earth abundant elements. For example, co-evaporation can be used to produce absorber layers comprising CZTS or $WS_2$. The co-evaporation can be performed as described above to prepare a graded absorber layer, or a 2-step process can be utilized. Co-evaporation can also be utilized to produce absorber layers comprising silicides and phosphides.

The efficiency of TFPV devices depends on many properties of the absorber layer and the buffer layer such as crystallinity, grain size, composition uniformity, density, defect concentration, doping level, surface roughness, etc.

The manufacture of TFPV devices entails the integration and sequencing of many unit processing steps. As an example, TFPV manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as TFPV devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching, texturing, polishing, cleaning, etc. HPC processing techniques have also been successfully adapted to deposition processes such as sputtering, atomic layer deposition (ALD), chemical surface deposition, dip coating, and chemical vapor deposition (CVD).

HPC processing techniques have been adapted to the development and investigation of absorber layers and buffer layers for TFPV solar cells as described in U.S. application Ser. No. 13/236,430 filed on Sep. 19, 2011, entitled "COMBINATORIAL METHODS FOR DEVELOPING SUPERSTRATE THIN FILM SOLAR CELLS" and is incorporated herein by reference. However, HPC processing techniques have not been successfully adapted to the development of contact structures for TFPV devices. Generally, there are two basic configurations for TFPV devices. The first configuration is known as a "substrate" configuration. In this configuration, the contact that is formed on or near the substrate is called the back contact. In this configuration, the light is incident on the TFPV device from the top of the material stack (i.e. the side opposite the substrate). CIGS TFPV devices are most commonly manufactured in this configuration. The second configuration is known as a "superstrate" configuration. In this configuration, the contact that is formed on or near the substrate is called the front contact. In this configuration, the light is incident on the TFPV device through the substrate. CdTe, and a-Si, TFPV devices are most commonly manufactured in this configuration. In both configurations, light trapping schemes may be implemented in the contact layer that is formed on or near the substrate. Additionally, other efficiency or durability improvements can be implemented in the contact layer that is formed farthest away from the substrate.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of TFPV manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a TFPV device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a TFPV device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the TFPV device. For example, such structures may include, but would not be limited to, contact layers, buffer layers, absorber layers, or any other series of layers or unit processes that create an intermediate structure found on TFPV devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
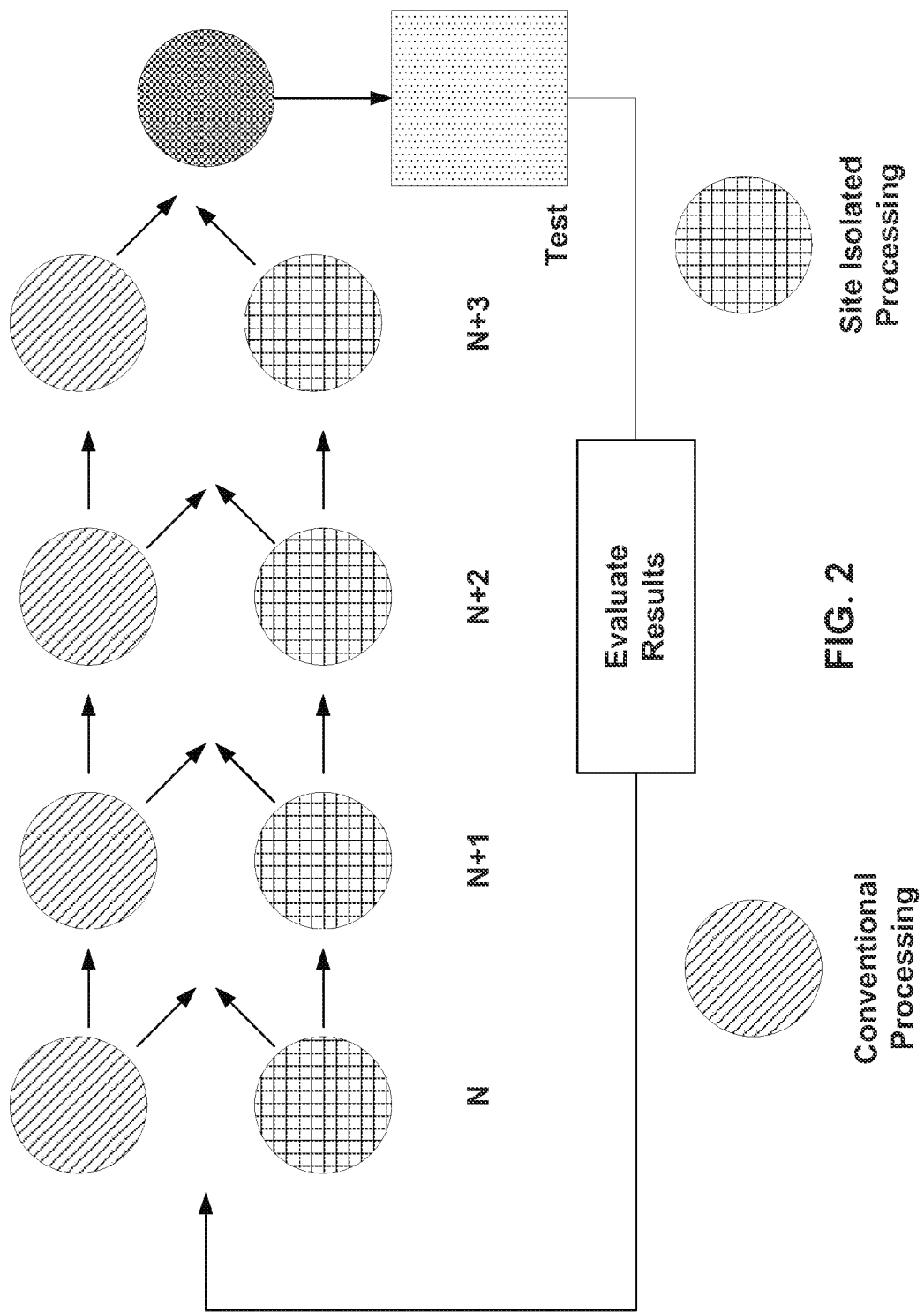
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. The combinatorial processing may employ uniform processing of site isolated regions or may employ gradient techniques. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in TFPV manufacturing may be varied.

As mentioned above, within a region, the process conditions are substantially uniform. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. However, in some embodiments, the processing may result in a gradient within the regions. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3:
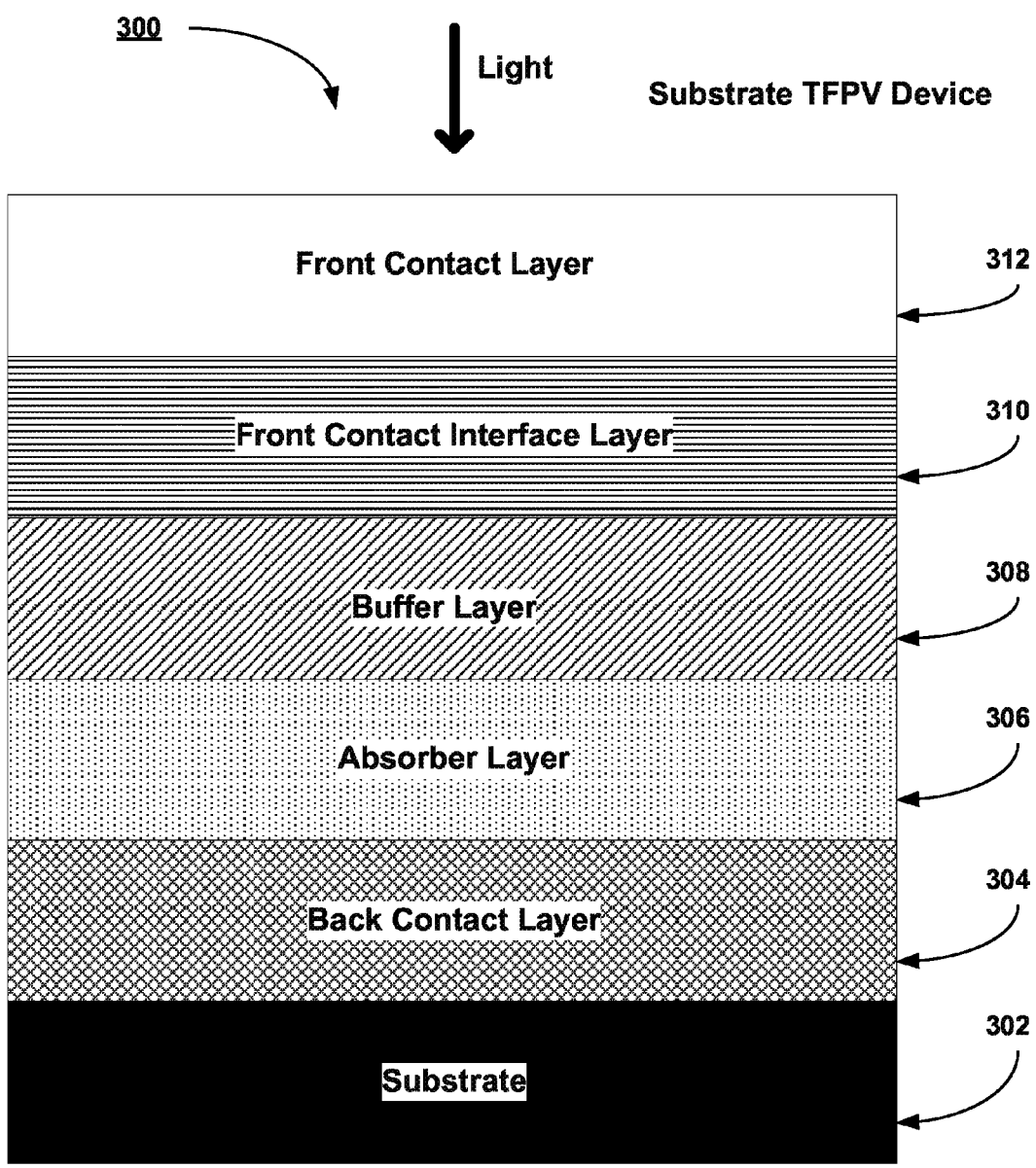
FIG. 3 illustrates a schematic diagram of a simple substrate TFPV stack according to an embodiment described herein.

FIG. 3 illustrates a schematic diagram of a simple TFPV device stack in the substrate configuration consistent with some embodiments of the present invention. The convention will be used wherein light is assumed to be incident upon the top of the material stack in the substrate configuration as illustrated. This generic diagram would be typical of a CTS or CZTS TFPV device. A back contact layer, 304, is formed on a substrate, 302. Examples of suitable substrates comprise float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, in-line continuous processing, roll-to-roll processing, etc. As used herein, the phrase "back contact" will be understood to be the primary current conductor layer situated between the substrate and the absorber layer in a substrate configuration TFPV device. An example of a common back contact layer material is Mo for CTS or CZTS TFPV devices. Other types of TFPV devices use different materials for the back contact. As an example, Cu-based materials such as Cu/Au, Cu/graphite, Cu/Mo, Cu:ZnTe/Mo, etc. are typically used for CdTe TFPV devices and transparent conductive oxide (TCO) materials such as ZnO, ITO, $SnO_2$:F, etc. are typically used for a-Si TFPV devices. The back contact layer may be formed by any number of deposition technologies. Examples of suitable deposition technologies comprise physical vapor deposition (PVD) (e.g. sputtering), evaporation, chemical vapor deposition (CVD), atomic layer deposition (ALD), plating, printing, wet coating, etc. The thickness of the back contact layer is typically between about 0.3 µm and about 1.0 µm. The back contact layer has a number of requirements such as high conductivity, good ohmic contact to the absorber layer, ease of bonding to tabs for external connectivity, ease of scribing or other removal, good thermo-mechanical stability, and chemical resistance during subsequent processing, among others.

Optionally, a diffusion barrier and/or adhesion-promotion layer (not shown) may be formed between the substrate and the back contact layer. When implemented, the diffusion barrier layer stops the diffusion of impurities from the substrate into the back contact layer, or alternatively, stops the diffusion and reaction of the back contact material with the substrate. Examples of common diffusion barrier and/or adhesion-promotion layers comprise chromium, vanadium, tungsten, nitrides such as tantalum nitride, tungsten nitride, titanium nitride, silicon nitride, zirconium nitride, hafnium nitride, oxy-nitrides such as tantalum oxy-nitride, tungsten oxy-nitride, titanium oxy-nitride, silicon oxy-nitride, zirconium oxy-nitride, hafnium oxy-nitride, oxides such as aluminum oxide, silicon oxide, carbides such as silicon carbide, binary and/or multinary compounds of tungsten, titanium, molybdenum, chromium, vanadium, tantalum, hafnium, zirconium, and/or niobium with/without the inclusion of nitrogen and/or oxygen. The diffusion barrier layer may be formed, partially or completely, from any well known technique such as sputtering, ALD, CVD, evaporation, wet methods such as printing or spraying of inks, screen printing, inkjet printing, slot die coating, gravure printing, wet chemical depositions, or from sol-gel methods, such as the coating, drying, and firing of polysilazanes.

A p-type absorber layer, 306, of CTS or CZTS is then deposited on top of the back contact layer. The absorber layer may be formed, partially or completely, using a variety of techniques such as PVD (sputtering), co-evaporation, in-line evaporation, plating, printing or spraying of inks, screen printing, inkjet printing, slot die coating, gravure printing, wet chemical depositions, CVD, etc. Advantageously, the absorber layer is deficient in Cu. The Cu deficiency may be controlled by managing the deposition conditions. Advantageously, a small amount of Na is present during the absorber growth. The Na may be added by out-diffusion from the soda lime glass substrate or may be purposely added in the form of $Na_2Se$, NaF, sodium alloys of Sn and/or Te, or another Na source, prior, during, or after the deposition and/or growth of the absorber layer. The absorber layer can be formed by depositing a multicomponent metal precursor film comprising Cu and Sn or Cu, Sn, and Zn, for example, by using metal targets, followed by chalcogenizing the layer, typically with sulfur (sulfurizing) or selenium (selenizing). The absorber layer can also be formed by depositing a multicomponent semiconductor film comprising $Cu_2SnS_3$ or $Cu_2ZnSnS_4$, for example, by using $Cu_2SnS_3$ or $Cu_2ZnSnS_4$ targets, followed by chalcogenizing the layer, typically with sulfur (sulfurizing) or selenium (selenizing). Optionally, the precursor and/or absorber layer undergoes a sulfurization or selenization process after formation to convert the precursor to CZTS into a high-quality CZTS semiconductor film (or the CTS precursor film to a high-quality CTS semiconductor film). The sulfurization or selenization process involves the exposure of the precursor and/or absorber layer to $H_2Se$, $H_2S$, Se vapor, S vapor, or diethylselenide (DESe) at temperatures most typically between about 300° C. and 700° C. It should be noted that the precursor to CTS or CZTS might already contain a chalcogen source (e.g., S), either as a separate layer, or incorporated into the bulk of the precursor layer. The precursor film can be a stack of layers, or one layer. The precursor layer can be dense, or porous. The precursor film typically contains Cu, Zn, and Sn to form CZTS, or Cu and Sn to form CTS. The precursor layer can be deposited by sputtering from e.g., metallic sputter targets. Binary and multinary sputter targets such as $Cu_2SnS_3$ or $Cu_2ZnSnS_4$, are utilized in some embodiments. In addition, plating and printing to deposit the metal precursor film containing Cu, Zn, and/or Sn can be used as well. During the selenization process, a layer of $Mo(S,Se)_2$ (not shown) forms at the back contact/absorber layer interface and forms a fairly good ohmic contact between the two layers. Alternatively, a layer of $Mo(S,Se)_2$ (not shown) can be deposited at the back contact/absorber layer interface using a variety of well known techniques such as PVD (sputtering), CBD, ALD, plating, etc. The thickness of the absorber layer is typically between about 1.0 µm and about 3.0 µm. The performance of the absorber layer is sensitive to materials properties such as crystallinity, grain size, surface roughness, composition, defect concentration, etc. as well as processing parameters such as temperature, deposition rate, thermal treatments, etc.

An n-type buffer layer, 308, is then deposited on top of the absorber layer. Examples of suitable n-type buffer layers comprise CdS, ZnS, $In_2S_3$, $In_2(S,Se)_3$, (Cd,Zn)S, ZnO, Zn(O, S), (Zn,Mg)O, etc. CdS is the material most often used as the n-type buffer layer in CZTS TFPV devices. The buffer layer may be deposited using chemical bath deposition (CBD), chemical surface deposition (CSD), PVD (sputtering), printing, plating, ALD, Ion-Layer-Gas-Reaction (ILGAR), ultrasonic spraying, or evaporation. The thickness of the buffer layer is typically between about 30 nm and about 100 nm. The performance of the buffer layer is sensitive to materials properties such as crystallinity, grain size, surface roughness, composition, defect concentration, etc. as well as processing parameters such as temperature, deposition rate, thermal treatments, etc.

Optionally, an intrinsic ZnO (iZnO) layer, 310, is then formed on top of the buffer layer. The iZnO layer is a high resistivity material and forms part of the transparent conductive oxide (TCO) stack that serves as part of the front contact structure. Other resistive metal oxides like $SnO_2$, resistive ZnO:Al, resistive In—Ga—Zn—O, etc. might be used instead of i-ZnO. The TCO stack is formed from transparent conductive metal oxide materials and collects charge across the face of the TFPV solar cell and conducts the charge to tabs used to connect the solar cell to external loads. The iZnO layer makes the TFPV solar cell less sensitive to lateral non-uniformities caused by differences in composition or defect concentration in the absorber and/or buffer layers. The iZnO layer is typically between about 0 nm and 150 nm in thickness. The iZnO layer is typically formed using a (reactive) PVD (sputtering) technique or CVD technique, but can be deposited by plating or printing as well. A low resistivity top TCO layer, 312, (examples include Al:ZnO (AZO), (In,Sn)O (ITO), (In,Zn)O, B:ZnO, Ga:ZnO, F:ZnO, $F:SnO_2$, etc.) is formed on top of the iZnO layer. The top TCO layer is typically between about 0.25 µm and 1.0 µm in thickness. The top TCO layer is typically formed using a (reactive) PVD (sputtering) technique or CVD technique. Optionally, the transparent top electrode can be printed or wet-coated from (silver) nano-wires, carbon nanotubes, and the like.

Figure 4:
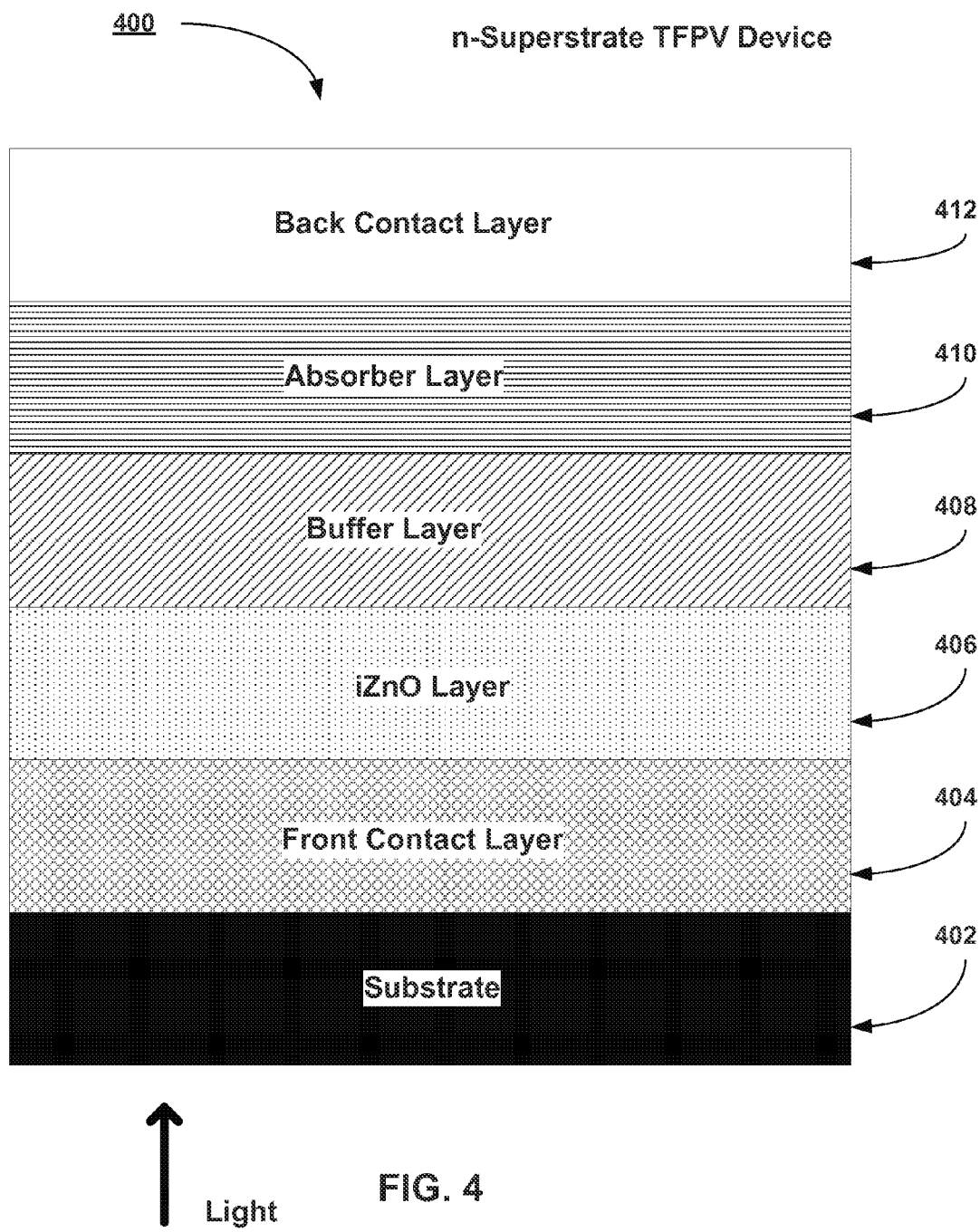
FIG. 4 illustrates a schematic diagram of a simple n-superstrate TFPV stack according to an embodiment described herein.

FIG. 4 illustrates a simple CTS or CZTS TFPV device material stack, 400, consistent with some embodiments of the present invention. The CTS or CZTS TFPV device illustrated in FIG. 4 is shown in a superstrate configuration wherein the glass substrate faces the incident sunlight. The convention will be used wherein light is assumed to be incident upon the substrate and material stack as illustrated. As used herein, this configuration will be labeled an "n-superstrate" configuration to denote that the n-type layer (i.e., buffer layer) is closest to the incident light. This label is to distinguish the configuration from an alternate configuration described with respect to FIG. 5 below. The formation of the CTS or CZTS TFPV device will be described starting with the substrate. Examples of suitable substrates comprise float glass, low-iron glass, borosilicate glass, flexible glass, specialty glass for high temperature processing, polyimide, plastics, etc. Furthermore, the substrates may be processed in many configurations such as single substrate processing, multiple substrate batch processing, in-line continuous processing, roll-to-roll processing, etc.

A low resistivity bottom TCO front contact layer, 404, (examples include Al:ZnO (AZO), (In,Sn)O (ITO), (In,Zn)O, B:ZnO, Ga:ZnO, F:ZnO, $F:SnO_2$, etc.) is formed on top of the substrate, 402. As used herein, the phrase "front contact" will be understood to be the primary current conductor layer situated between the substrate and the buffer layer in a superstrate configuration TFPV device. The bottom TCO layer is typically between about 0.3 µm and 2.0 µm in thickness. The bottom TCO layer is typically formed using a reactive PVD (sputtering) technique or CVD technique.

Optionally, a diffusion barrier and/or adhesion-promotion layer (not shown) may be formed between the substrate, 402, and the front contact layer, 404. When implemented, the diffusion barrier layer stops the diffusion of impurities from the substrate into the TCO, or alternatively, stops the diffusion and reaction of the TCO material and above layers with the substrate. Examples of common diffusion barrier and/or adhesion-promotion layers comprise chromium, vanadium, tungsten, nitrides such as tantalum nitride, tungsten nitride, titanium nitride, silicon nitride, zirconium nitride, hafnium nitride, oxy-nitrides such as tantalum oxy-nitride, tungsten oxy-nitride, titanium oxy-nitride, silicon oxy-nitride, zirconium oxy-nitride, hafnium oxy-nitride, oxides such as aluminum oxide, silicon oxide, carbides such as silicon carbide, binary and/or multinary compounds of tungsten, titanium, molybdenum, chromium, vanadium, tantalum, hafnium, zirconium, and/or niobium with/without the inclusion of nitrogen and/or oxygen. It should be understood that the diffusion barrier layer composition and thickness are optimized for optical transparency as necessary for the superstrate configuration. The diffusion barrier layer may be formed from any well known technique such as sputtering, ALD, CVD, evaporation, wet methods such as printing or spraying of inks, screen printing, inkjet printing, slot die coating, gravure printing, wet chemical depositions, or from sol-gel methods, such as the coating, drying, and firing of polysilazanes.

An intrinsic iZnO layer, 406, is then formed on top of the TCO layer. The iZnO layer is a high resistivity material and forms part of the transparent conductive oxide (TCO) stack that serves as part of the front contact structure. Other resistive metal oxides like $SnO_2$, resistive ZnO:Al, resistive In—Ga—Zn—O, etc. might be used instead of i-ZnO. The iZnO layer makes the TFPV device less sensitive to lateral non-uniformities caused by differences in composition or defect concentration in the absorber and/or buffer layers. The iZnO layer is typically between about 0 nm and 150 nm in thickness. The iZnO layer is typically formed using a reactive PVD (sputtering) technique or CVD technique.

An n-type buffer layer, 408, is then deposited on top of the iZnO layer, 406. Examples of suitable n-type buffer layers comprise CdS, ZnS, $In_2S_3$, $In_2(S,Se)_3$, (Cd,Zn)S, ZnO, Zn(O, S), (Zn,Mg)O, etc. CdS is the material most often used as the n-type buffer layer in CZTS TFPV devices. The buffer layer may be deposited using chemical bath deposition (CBD), chemical surface deposition (CSD), close space sublimation, PVD (sputtering), printing, plating, ALD, Ion-Layer-Gas-Reaction (ILGAR), ultrasonic spraying, or evaporation. The thickness of the buffer layer is typically between about 30 nm and about 100 nm. The performance of the buffer layer is sensitive to materials properties such as crystallinity, grain size, surface roughness, composition, defect concentration, etc. as well as processing parameters such as temperature, deposition rate, thermal treatments, etc.

A p-type absorber layer, 410, of CTS or CZTS is then deposited on top of the buffer layer. The absorber layer may be formed, partially or completely, using a variety of techniques such as PVD (sputtering), co-evaporation, in-line evaporation, plating, printing or spraying of inks, screen printing, inkjet printing, slot die coating, gravure printing, wet chemical depositions, CVD, etc. Advantageously, the absorber layer is deficient in Cu. The Cu deficiency may be controlled by managing the deposition conditions. Advantageously, a small amount of Na is present during the growth of the absorber. The Na may be purposely added in the form of $Na_2Se$ or another Na source, prior, during, or after the deposition and/or growth of the absorber layer. The absorber layer can be formed by depositing a multicomponent metal precursor film comprising Cu and Sn or Cu, Sn, and Zn, for example, by using metal targets, followed by chalcogenizing the layer, typically with sulfur (sulfurizing) or selenium (selenizing). The absorber layer can also be formed by depositing a multicomponent semiconductor film comprising $Cu_2SnS_3$ or $Cu_2ZnSnS_4$, for example, by using $Cu_2SnS_3$ or $Cu_2ZnSnS_4$ targets, followed by chalcogenizing the layer, typically with sulfur (sulfurizing) or selenium (selenizing). Optionally, the precursor and/or absorber layer undergoes a sulfurization or selenization process after formation to convert the precursor to CZTS into a high-quality CZTS semiconductor film (or the CTS precursor film to a high-quality CTS semiconductor film). The sulfurization or selenization process involves the exposure of the precursor and/or absorber layer to $H_2Se$, $H_2S$, Se vapor, S vapor, or diethylselenide (DESe) at temperatures most typically between about 300° C. and 700° C. It should be noted that the precursor to CTS or CZTS might already contain a chalcogen source (e.g. S), either as a separate layer, or incorporated into the bulk of the precursor layer. The precursor film can be a stack of layers, or one layer. The precursor layer can be dense, or porous. The precursor film typically contains Cu, Zn, and Sn. The precursor layer can be deposited by sputtering from e.g., metallic sputter targets. Binary and multinary sputter targets such as $Cu_2SnS_3$ or $Cu_2ZnSnS_4$, are utilized in some embodiments. In addition, plating and printing to deposit the metal precursor film containing Cu, Zn, and/or Sn can be used as well. During subsequent processing, a layer of $Mo(S,Se)_2$ (not shown) is formed at the back contact/absorber layer interface and forms a fairly good ohmic contact between the two layers. The thickness of the absorber layer is typically between about 1.0 μm and about 3.0 μm. The performance of the absorber layer is sensitive to materials properties such as crystallinity, grain size, surface roughness, composition, defect concentration, etc. as well as processing parameters such as temperature, deposition rate, thermal treatments, etc.

A back contact layer, 412, is formed on absorber layer, 410. An example of a common back contact layer material is Mo for CIGS and CZTS TFPV devices. The back contact layer may be formed by any number of deposition technologies. Examples of suitable deposition technologies comprise PVD (sputtering), evaporation, chemical vapor deposition (CVD), atomic layer deposition (ALD), plating, etc. The thickness of the back contact layer is typically between about 0.3 μm and about 1.0 μm. The back contact layer has a number of requirements such as high conductivity, good ohmic contact to the absorber layer, ease of bonding to tabs for external connectivity, ease of scribing or other removal, good thermo-mechanical stability, and chemical resistance during subsequent processing, among others. Other types of TFPV devices use different materials for the back contact. As an example, Cu-based materials such as Cu/Au, Cu/graphite, Cu/Mo, Cu:ZnTe/Mo, etc. are typically used for CdTe TFPV devices and TCO materials such as ZnO, ITO, $SnO_2$:F, etc. are typically used for a-Si TFPV devices.

Figure 5:
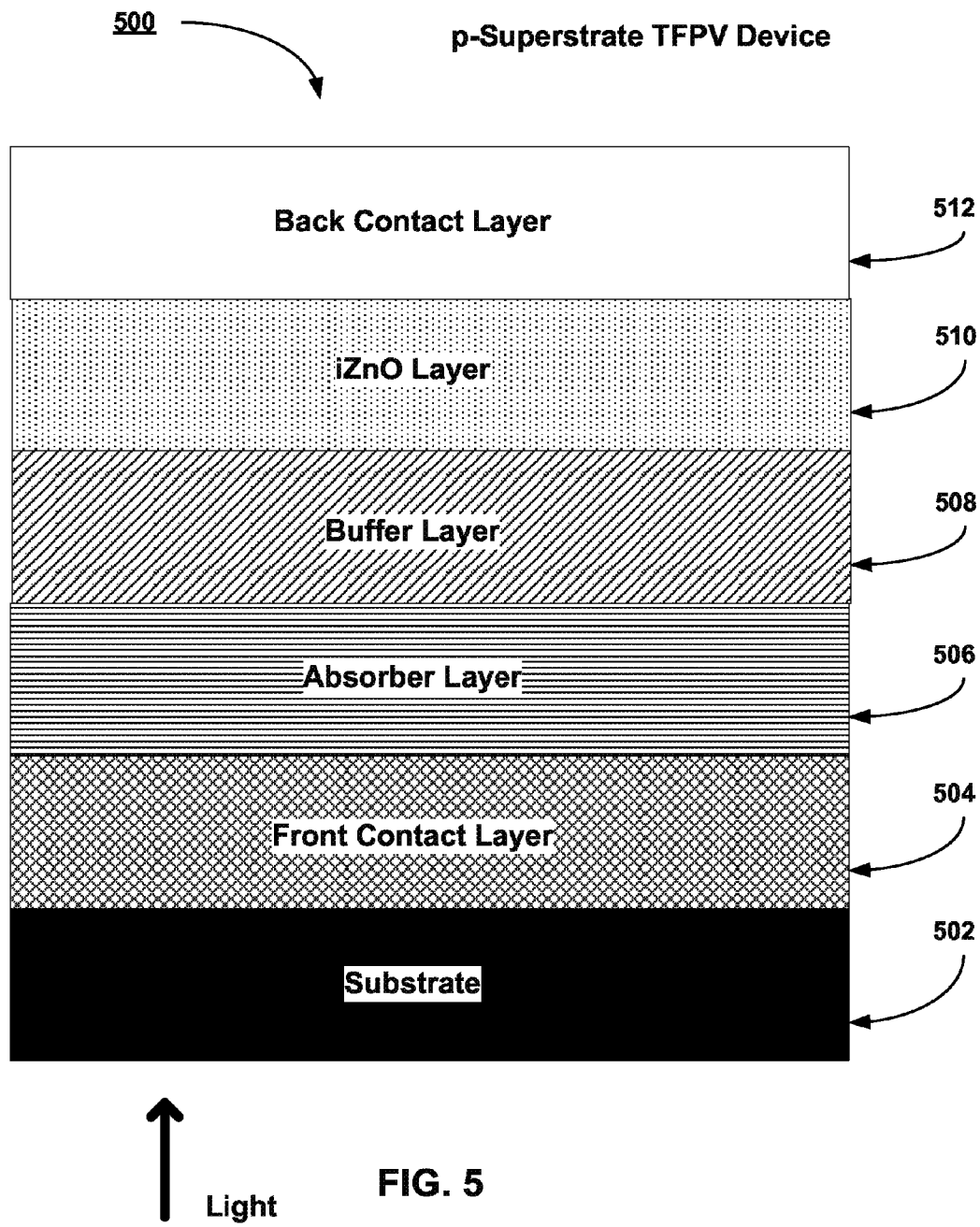
FIG. 5 illustrates a schematic diagram of a simple p-superstrate TFPV stack according to an embodiment described herein.

FIG. 5 illustrates a simple CZTS TFPV device material stack, 500, consistent with some embodiments of the present invention. The CZTS TFPV device illustrated in FIG. 5 is shown in a superstrate configuration wherein the glass substrate faces the incident sunlight. The convention will be used wherein light is assumed to be incident upon the substrate and material stack as illustrated. As used herein, this configuration will be labeled a "p-superstrate" configuration to denote that the p-type layer (i.e. absorber layer) is closest to the incident light. This label is to distinguish the configuration from the alternate configuration described with respect to FIG. 4 previously. The formation of the CZTS TFPV device will be described starting with the substrate. A similar structure and similar method would also be applicable to the formation of a CZTS TFPV solar cell fabricated with a superstrate configuration. Examples of suitable substrates comprise float glass, low-iron glass, borosilicate glass, flexible glass, specialty glass for high temperature processing, polyimide, plastics, etc. Furthermore, the substrates may be processed in many configurations such as single substrate processing, multiple substrate batch processing, in-line continuous processing, roll-to-roll processing, etc.

A low resistivity bottom TCO front contact layer (examples include Al:ZnO (AZO), (In,Sn)O (ITO), (In,Zn)O, B:ZnO, Ga:ZnO, F:ZnO, F:$SnO_2$, etc.), 504, is formed on top of the substrate, 502. As used herein, the phrase "front contact" will be understood to be the primary current conductor layer situated between the substrate and the absorber layer in a superstrate configuration TFPV device. The bottom TCO layer is typically between about 0.3 um and 2.0 um in thickness. The bottom TCO layer is typically formed using a reactive PVD (sputtering) technique or CVD technique. The TCO can be a p-type TCO, (e.g. ternary-based oxide in the family of $Co_3O_4$-based spinels, like $Co_2ZnO_4$ and $Co_2NiO_4$). Nevertheless, it should be understood that an n-type TCO with an additional layer (e.g., a heavily-doped p-type semiconductor layer, or $MoSe_2$) between the TCO and the absorber can be used as well. Furthermore, the TCO might be a bi- or multi-layer of an n-type TCO in contact with the substrate, followed by an ultrathin metal layer, (e.g. like Ag), followed by a thin p-type TCO in contact with the absorber layer, with/without an additional $MoSe_2$ layer between the p-type TCO and the absorber layer.

Optionally, a diffusion barrier and/or adhesion-promotion layer (not shown) may be formed between the substrate, 502, and the front contact layer 504. When implemented, the diffusion barrier and/or adhesion-promotion layer stops the diffusion of impurities from the substrate into the TCO, or alternatively, stops the diffusion and reaction of the TCO material and above layers with the substrate. Examples of common diffusion barrier and/or adhesion-promotion layers comprise chromium, vanadium, tungsten, nitrides such as tantalum nitride, tungsten nitride, titanium nitride, silicon nitride, zirconium nitride, hafnium nitride, oxy-nitrides such as tantalum oxy-nitride, tungsten oxy-nitride, titanium oxy-nitride, silicon oxy-nitride, zirconium oxy-nitride, hafnium oxy-nitride, oxides such as aluminum oxide, silicon oxide, carbides such as silicon carbide, binary and/or multinary compounds of tungsten, titanium, molybdenum, chromium, vanadium, tantalum, hafnium, zirconium, and/or niobium with/without the inclusion of nitrogen and/or oxygen. It should be understood that the diffusion barrier and/or adhesion-promotion layer composition and thickness are optimized for optical transparency as necessary for the superstrate configuration. The diffusion barrier and/or adhesion-promotion layer may be formed from any well known technique such as sputtering, ALD, CVD, evaporation, wet methods such as printing or spraying of inks, screen printing, inkjet printing, slot die coating, gravure printing, wet chemical depositions, or from sol-gel methods such as the coating, drying, and firing of polysilazanes.

A p-type absorber layer, 506, of CTS or CZTS is then deposited on top of the front contact layer. The absorber layer may be formed, partially, or completely, using a variety of techniques such as PVD (sputtering), co-evaporation, in-line evaporation, plating, printing or spraying of inks, screen printing, inkjet printing, slot die coating, gravure printing, wet chemical depositions, CVD, etc. Advantageously, the absorber layer is deficient in Cu. The Cu deficiency may be controlled by managing the deposition conditions. Advantageously, a small amount of Na is present during the growth of the absorber. The Na may be purposely added in the form of $Na_2Se$ or another Na source, prior, during, or after the deposition of the precursor and/or absorber layer. The absorber layer can be formed by depositing a multicomponent metal precursor film comprising Cu and Sn or Cu, Sn, and Zn, for example, by using metal targets, followed by chalcogenizing the layer, typically with sulfur (sulfurizing) or selenium (selenizing). The absorber layer can also be formed by depositing a multicomponent semiconductor film comprising $Cu_2SnS_3$ or $Cu_2ZnSnS_4$, for example, by using $Cu_2SnS_3$ or $Cu_2ZnSnS_4$ targets, followed by chalcogenizing the layer, typically with sulfur (sulfurizing) or selenium (selenizing). Optionally, the precursor and/or absorber layer undergoes a sulfurization or selenization process after formation to convert the precursor to CZTS into a high-quality CZTS semiconductor film (or the CTS precursor film to a high-quality CTS semiconductor film). The sulfurization or selenization process involves the exposure of the precursor and/or absorber layer to $H_2Se$, $H_2S$, Se vapor, S vapor, or diethylselenide (DESe) at temperatures most typically between about 300° C. and 700° C. It should be noted that the precursor to CTS or CZTS might already contain a chalcogen source (e.g. S), either as a separate layer, or incorporated into the bulk of the precursor layer. The precursor film can be a stack of layers, or one layer. The precursor layer can be dense, or porous. The precursor film typically contains Cu, Zn, and Sn. The precursor layer is most commonly deposited by sputtering from e.g. metallic sputter targets. However, binary and multinary sputter targets such as $Cu_2SnS_3$ or $Cu_2ZnSnS_4$, are utilized in some embodiments. In addition, plating and printing to deposit the metal precursor film containing Cu, Zn, and/or Sn can be used as well. The thickness of the absorber layer is typically between about 1.0 µm and about 3.0 µm. The performance of the absorber layer is sensitive to materials properties such as crystallinity, grain size, surface roughness, composition, defect concentration, etc. as well as processing parameters such as temperature, deposition rate, thermal treatments, etc.

An n-type buffer layer, 508, is then deposited on top of the absorber layer. Examples of suitable n-type buffer layers comprise CdS, ZnS, $In_2S_3$, $In_2(S,Se)_3$, (Cd,Zn)S, ZnO, Zn(O, S), (Zn,Mg)O, etc. CdS is the material most often used as the n-type buffer layer in CZTS or CZTS TFPV devices. The buffer layer may be deposited using chemical bath deposition (CBD), chemical surface deposition (CSD), PVD (sputtering), printing, plating, ALD, Ion-Layer-Gas-Reaction (IL-GAR), ultrasonic spraying, or evaporation. The thickness of the buffer layer is typically between about 30 nm and about 100 nm. The performance of the buffer layer is sensitive to materials properties such as crystallinity, grain size, surface roughness, composition, defect concentration, etc. as well as processing parameters such as temperature, deposition rate, thermal treatments, etc.

An intrinsic iZnO layer, 510, is then formed on top of the buffer layer. The iZnO layer is a high resistivity material and forms part of the back contact structure. Other resistive metal oxides like $SnO_2$, resistive ZnO:Al, resistive In—Ga—Zn—O, etc. might be used instead of i-ZnO. The iZnO layer makes the TFPV device less sensitive to lateral non-uniformities caused by differences in composition or defect concentration in the absorber and/or buffer layers. The iZnO layer is typically between about 0 nm and 150 nm in thickness. The iZnO layer is typically formed using a reactive PVD (sputtering) technique or CVD technique.

A back contact layer, 512, is formed on intrinsic iZnO layer, 510. An example of a suitable back contact layer material is a thin n-type TCO followed by Ni and/or Al. The back contact layer may be formed by any number of deposition technologies. Examples of suitable deposition technologies comprise PVD (sputtering), evaporation, chemical vapor deposition (CVD), atomic layer deposition (ALD), plating, etc. The thickness of the back contact layer is typically between about 0.3 µm and about 1.0 µm. The back contact layer has a number of requirements such as high conductivity, good ohmic contact to the absorber layer, ease of bonding to tabs for external connectivity, ease of scribing or other removal, good thermo-mechanical stability, and chemical resistance during subsequent processing, among others. Other types of TFPV devices use different materials for the back contact. As an example, Cu-based materials such as Cu/Au, Cu/graphite, Cu/Mo, Cu:ZnTe/Mo, etc. are typically used for CdTe TFPV devices and TCO materials such as ZnO, ITO, $SnO_2$:F, etc. are typically used for a-Si TFPV devices.

The film stack described above is just one example of a film stack that can be used for TFPV devices. As an example, another substrate film stack (i.e. similar configuration as FIG. 3) might be: substrate/AZO/Mo/Mo—Se/CZTS/CdS/iZnO/AZO, with AZO being ZnO:Al. As an example, another p-superstrate film stack (i.e. similar configuration as FIG. 5) might be: substrate/barrier/ZnO:Al/Mo/Mo—Se/CZTS/CdS/iZnO/ZnO:Al/Al. The detailed film stack configuration is not meant to be limiting, but simply serves as an example of the implementation of embodiments of the present invention.

Figure 6:
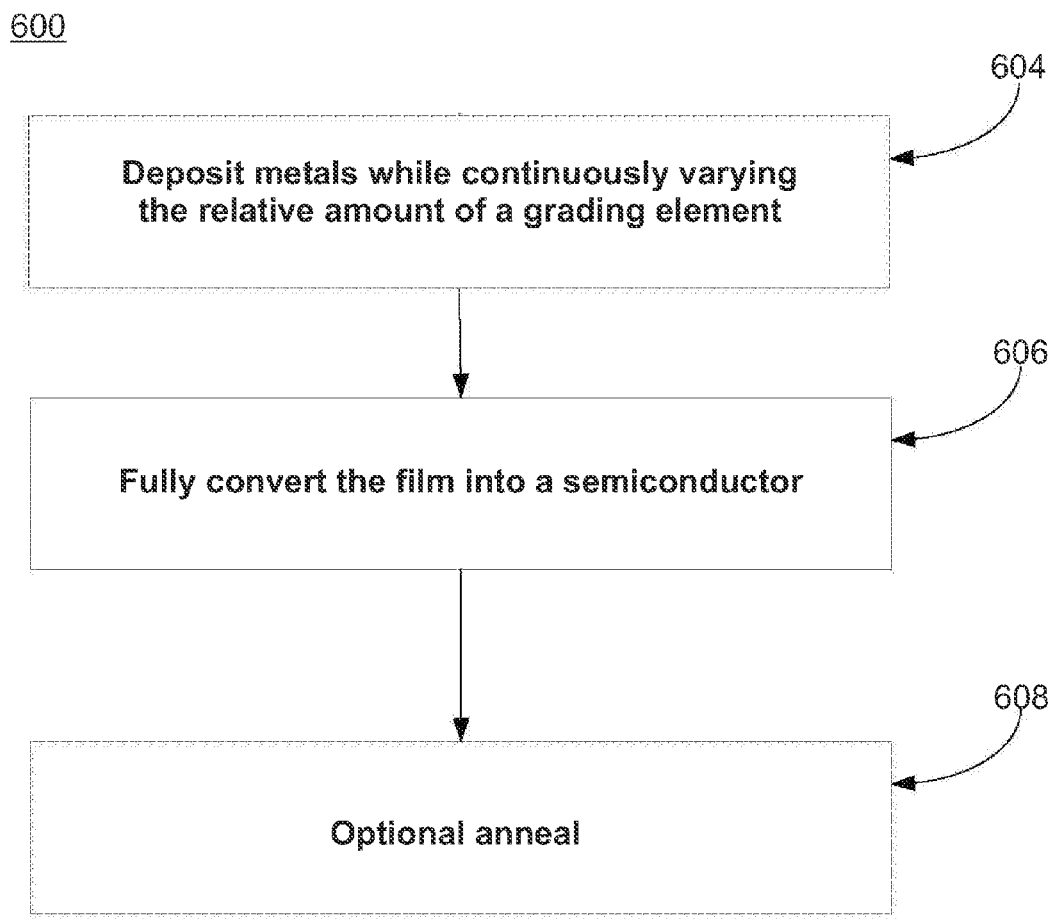
FIG. 6 provides a flow chart for a generic 2-step process.

The formation of the absorber layer is typically a multi-step process. One way of bandgap grading absorber materials is by a 2-step approach as illustrated in FIG. 6. For a continuously variable bandgap gradient, the absorber materials can be deposited by continuously varying the composition of the deposited material. In step 604, metal-containing films are deposited, using a plurality of absorber materials to provide a varying composition. For deposition of the absorber materials, the methods described in U.S. patent application Ser. No. 13/595,888, filed Aug. 27, 2012, and U.S. patent application Ser. Nos. 13/596,387, 13/596,288, 13/596,344, 13/596,439, filed Aug. 28, 2012, the disclosures of which are incorporated by reference in their entireties for all purposes, can be utilized.

For CZTS-like absorbers, the metal-containing films comprise Group IB, Group-IIB, and Group-IVA elements. The metal-containing films can comprise elemental metal or one or more compounds of Group IB, Group-IIB, and Group-IVA elements with one or more elements from Group VIA. The bandgap grading is accomplished by varying the gradient of the composition. For example, substitution of Ag for Cu increases the bandgap; substitution of Si or Ge for Sn increases the bandgap, while substitution of Pb for Sn decreases the bandgap.

This metal-containing film needs to be converted to one or more chalcogenide compound(s) to form the absorber layer. The metal precursor film is converted to one or more chalcogenide compound(s) by heating the film in the presence of a source of one or more Group-VIA elements as indicated in step 606. The chalcogenization process can include both selenization and sulfurization, meaning the final absorber (CZTSSe) contains both selenium and sulfur. Choice of sulfurization or selenization also affects the bandgap of the absorber material. Optionally, the chalcogenide film can be annealed as indicated in step 608.

Generally, the 2-step method may comprise more than two steps when various wet chemical and/or conversion methods and/or wet or dry surface treatments (e.g. for densification or contaminant removal) and/or deposition steps (e.g. for a separate chalcogen layer as discussed previously) are used to form the metal precursor film. The metal-containing film may be dense or porous. The 2-step approach based on Cu(In,Ga) followed by selenization (without introducing sulfur) results in flat bandgap profiles, or single-graded CIGSe, resulting in efficiencies <16.0%. Absorber layers comprising CZTS or CZTSSe today achieve up to 11%, typically un-graded.

It should be noted that the above cited efficiencies are laboratory champion efficiencies for ~0.5 cm$^2$ solar cells, not to be confused with commercially available, average, solar panel efficiencies which are typically 5-6% lower than laboratory champions, due to a combination of non-uniformity within solar cells, mismatch between series-connected cells, absorption losses in thick TCO layers, encapsulant, and glass, scribe and edge losses, and additional series resistance, all in addition to running a different process in the factory compared to the laboratory.

Figure 7:
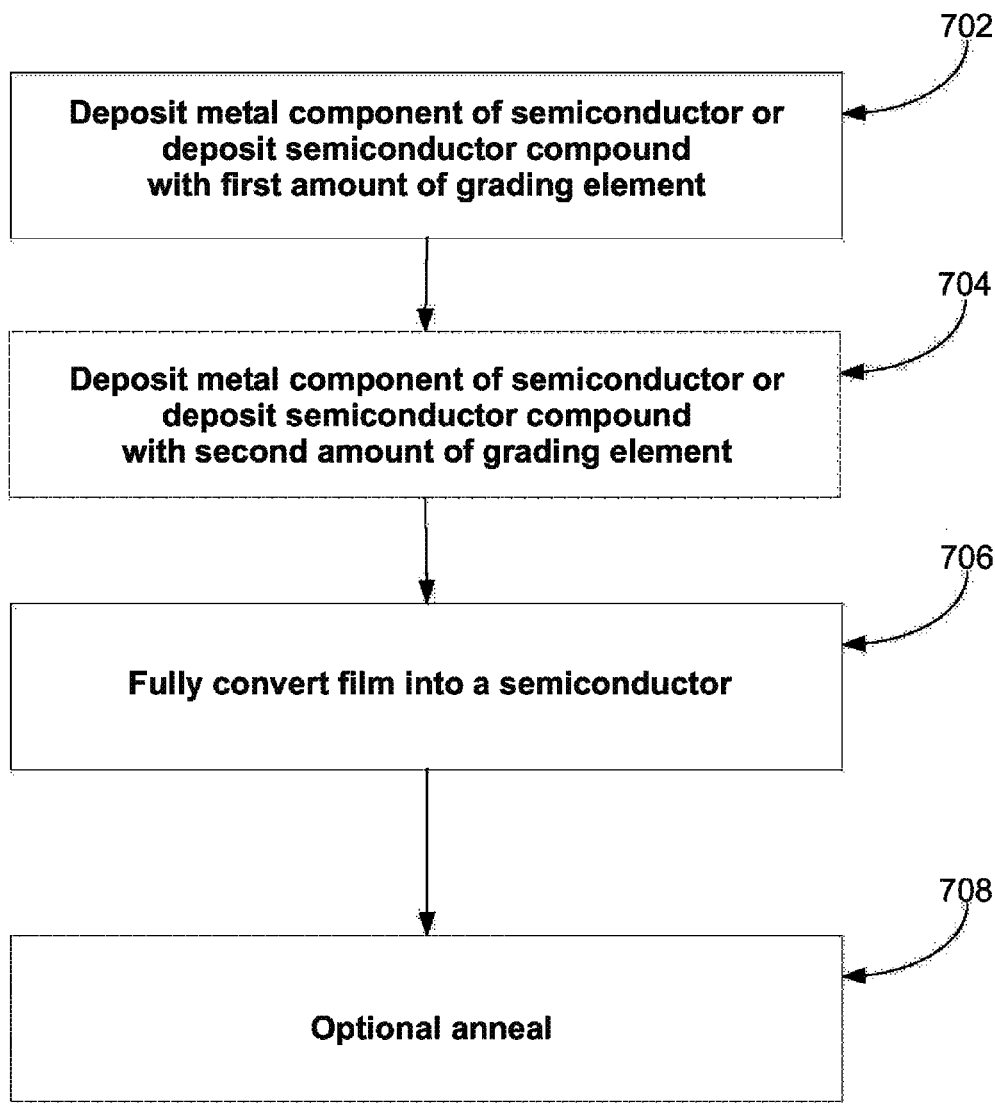
FIG. 7 provides a flow chart for a generic 3-step process.

A second way of grading CZTS materials is by a 3-step approach as illustrated in FIG. 7. In step 702, metal-containing films are deposited. The metal-containing films can include the metal component of a semiconductor or a semiconductor compound. The metal-containing films can also comprise a grading element. For CZTS-like absorbers, the metal-containing films comprise Group IB, Group-IIB, and Group-IVA elements. The metal-containing films can comprise elemental metal or one or more compounds of Group IB, Group-IIB, and Group-IVA elements with one or more elements from Group VIA. For example, substitution of Ag for Cu increases the bandgap; substitution of Si or Ge for Sn increases the bandgap, while substitution of Pb for Sn decreases the bandgap.

In step 704, additional metal-containing films are deposited. This film generally will have a different amount of a grading element so that the bandgap of the finished semiconductor is different from the bandgap of the semiconductor formed from the film deposited in step 702. In this method, the bandgap grading is accomplished by varying the composition between the two layers. It will be understood that additional layers having the same or varying bandgap can be further deposited.

This metal film needs to be converted to a chalcogenide to form the absorber layer. In step 706, the entire precursor stack to form the final absorber is converted using a chalcogenization process. The metal precursor film is converted to one or more chalcogenide compound(s) by heating the film in the presence of a source of one or more Group-VIA elements as indicated in step 606. The chalcogenization process can include both selenization and sulfurization, meaning the final absorber (CZTSSe) contains both selenium and sulfur. Choice of sulfurization or selenization also affects the bandgap of the absorber material. The chalcogenization process may include an additional anneal step at the end to improve the device performance, as illustrated in step 708. The device performance may be improved by improving layer crystal quality, grain size, compositional homogeneity, or optoelectronic qualities, as measured by XRD, SEM, SIMS and photoluminescence. Details of a chalcogenization process including an additional anneal step are described in U.S. patent application Ser. No. 13/283,225, entitled "Method of Fabricating CIGS by Selenization at High Temperatures", filed on Oct. 27, 2011, which is herein incorporated by reference.

Generally, the 3-step method may comprise more than 3 steps when various wet chemical and/or conversion methods and/or wet or dry surface treatments (e.g., for densification or contaminant removal) and/or deposition steps are used to form the metal precursor film and/or the metal rich layer. As discussed above, the metal precursor film and/or the metal rich layer may each be a single layer or may each be formed from multiple layers, it may be dense or porous.

In each of the multi-step methods described herein, the performance of the absorber layer can be improved by incorporating a small amount (i.e. about 0.1 atomic %) of Na prior, during, or after the growth of the absorber layer. The incorporation of Na results in improved film morphology, higher conductivity, and beneficial changes in the defect distribution within the absorber material. The Na may be introduced in a number of ways. The Na may diffuse out of the glass substrate, out of a layer disposed between the glass substrate and the back contact (e.g., a Na containing sol-gel layer formed under the back contact), or out of the back contact (e.g., molybdenum doped with a Na salt). The Na may be introduced from a separate Na containing layer formed on top of the back contact. The Na may be introduced by incorporating a Na source in the metal precursor film containing Cu, Sn, and/or Zn. Examples of suitable Na sources comprise $Na_2Se$, $Na_2O_2$, NaF, $Na_2S$, etc. The Na may be introduced from a separate Na containing layer formed on top of the precursor film containing Cu, Sn, and/or Zn. The Na may be introduced from a separate Na containing layer formed on top of the partially or completely chalcogenized CTS or CZTS film. The Na may be introduced by incorporating a Na source during the selenization step. The Na may be introduced after the final selenization step, followed by a heat treatment. The Na may be introduced by combining any of these methods as required to improve the performance of the absorber layer. It should be noted that similar Group IA, and/or Group IIA elements like K, and Ca might be used instead of sodium.

In each of the multi-step methods described above, a metal precursor film(s) can be deposited, a semiconductor material can be deposited, or a combination of metal and semiconductor can be deposited. For example, the metal precursor film can be deposited using PVD from metal targets. The semiconductor material can be deposited using PVD from semiconductor targets. For example, targets comprising binary targets such as $Cu_xS_y$, e.g., $Cu_2S_1$ or $Cu_1S_1$, $Zn_xS_y$, e.g., $Zn_1S_1$, $Sn_xS_y$, e.g., $Sn_1S_1$ or $Sn_2S_3$ or $Sn_1S_2$, $Cu_xSe_y$, e.g., $Cu_2Se_1$ or $Cu_1Se_1$ or $Cu_1Se_2$, $Zn_xSe_y$, e.g., $Zn_1Se_1$, $Sn_xSe_y$, e.g., $Sn_1Se_1$, or multinary targets such as $Cu_xZn_ySn_zS_v$, e.g., $Cu_2Zn_1Sn_1S_4$, $Cu_xZn_ySn_zSe_w$, e.g., $Cu_2Zn_1Sn_1Se_4$, or $Cu_xZn_ySn_zSe_wS_v$, e.g., $Cu_2Zn_1Sn_1Se_2S_2$, where the values of x, y, z, w and v can vary, can be utilized. These values will be close to line compounds, solid solutions, or a mixture of line compounds (i.e., compounds having a defined stoichiometry), solid solutions, and the elements, as dictated by the phase diagrams. The values will be optimized to enhance ease of target manufacturing, deposition rate, and achieving the desired film composition. The semiconductor compound can be stoichiometric or nonstoichiometric. A combination of PVD targets can be used to prepare metal precursor or metal-containing films having varying compositions and varying bandgap.

Typically, the precursor material will deviate in shape, size, composition, homogeneity, crystallinity, or some combination of these parameters from the absorber material that is ultimately formed as a result of the method. As mentioned previously, the metal precursor film(s) can comprise multiple layers. These layers may be deposited by the same or by different deposition techniques. These layers can be porous, or dense.

The metal precursor film(s) can be deposited using a number of techniques. Examples comprise dry processing (including deposition) techniques such as batch or in-line (co)

evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, etc. Examples of other techniques that can be used to deposit the metal precursor materials comprise ion-layer-gas-reaction (ILGAR), hot liquid metal deposition, as well as wet processing techniques such as sol-gel techniques, metal emulsions, electroplating, electroless plating, chemical bath deposition (CBD), and chemical surface deposition (CSD).

One or more wet chemical surface or film treatments may be used to remove unwanted material, replace unwanted material with wanted material (e.g. by ionic exchange), convert the film or surface, or add material to the film. Advantageously, treatments using these techniques occur at atmospheric pressure and at temperatures between room temperature and 90° C. Additionally, it is advantageous if the treatments using these techniques can be accomplished without the use of electromagnetic sources such as ultraviolet (UV) light and/or electric fields. Examples of wet chemical surface or film treatments comprise KCN-etch, $Br_2$/MeOH etch, partial electrolyte treatments, acid etch, alkaline etch, $NH_3$ treatment, etc. Nevertheless, dry surface treatments as commonly applied in vacuum might be used as well.

One or more heat treatments may be required after the deposition of the metal precursor materials using one of the deposition techniques described previously to convert the metal precursor materials into high quality, dense, semiconductor materials. In some embodiments, these processes include chalcogenization, two examples of which are selenization, and sulfurization. Typically, the heat treatment utilizes a suitable atmosphere such as $N_2$, $H_2$, CO, $H_2Se$, $H_2S$, $H_2Te$, diethyl selenide (DESe), diethyl telluride (DETe), Se, S, Te, or combinations thereof. The contaminants inherently present in inks or liquid vehicle formulations might be partially or fully removed by atmospheric plasma glow discharge treatments, UV-ozone treatments, laser treatments, treatments with weak (in)organic acids, etc.

In some embodiments, the conversion method involves subjecting the metal precursor film to a chalcogenization process wherein the metal precursor materials are converted to chalcogenide materials. The substrate and the metal precursor materials are heated in the presence of a suitable chalcogen source (e.g., $H_2Se$, $H_2S$, $H_2Te$, diethyl selenide (DESe), diethyl telluride (DETe), Se, S, Te, or combinations thereof, etc.) in an atmosphere with a low $O_2$ and/or low $H_2O$ content. The atmosphere typically comprises inert gases such as $N_2$ and/or Ar. Alternatively, the chalcogen (i.e., Se, S, Te) can be deposited as a solid (either elemental or as a suitable compound) on the surface of the metal precursor materials prior to the heat treatment. The chalcogen solid may be deposited using a vacuum process, an atmospheric process, a printing process, a wet coating process, other solution based processes, or some combination thereof.

In some embodiments, the conversion method involves subjecting the metal precursor film to a nitridization or phosphidization process wherein the metal precursor materials are converted to nitride or phosphide materials, or mixtures thereof. The substrate and the metal precursor materials are heated in the presence of a suitable nitrogen or phosphorous source (e.g., $NH_3$), plasma enhanced nitrogen (e.g., $NH_3$, $N_2$), or combinations thereof, etc.) in an atmosphere with a low $O_2$ and/or low $H_2O$ content. The atmosphere typically comprises inert gases such as Ar. Alternatively, the N or P can be deposited as a solid (either elemental for P or as a suitable compound for N) on the surface of the metal precursor materials prior to the heat treatment. The N or P containing solid may be deposited using a vacuum process, an atmospheric process, a printing process, a wet coating process, other solution based processes, or some combination thereof.

In some embodiments, the conversion method involves subjecting the metal precursor film to a silicidization process wherein the metal precursor materials are converted to silicide materials, or mixtures thereof. The substrate and the metal precursor materials are heated in the presence of a suitable silicon source (e.g., $(CH_3)_4S_1$, $H_4Si$), or combinations thereof, etc.) in an atmosphere with a low $O_2$ and/or low $H_2O$ content. The atmosphere typically comprises inert gases such as Ar. Alternatively, the Si can be deposited as a solid (either elemental or as a suitable compound) on the surface of the substrate or on the metal precursor materials prior to the heat treatment. The Si solid may be deposited using a vacuum process, an atmospheric process, a printing process, a wet coating process, other solution based processes, or some combination thereof.

Any suitable heat treating technique may be used during the conversion process. Examples comprise convective heating, conductive heating, radiative heating, or combinations thereof. Furthermore, common heating methods comprise infra-red (IR) lamps, resistive heating, muffle heating, strip heating, laser heating, flash lamps, etc. In some embodiments, thermal treatments can also be implemented in a site-isolated manner on discrete SIRs as taught in U.S. patent application Ser. No. 13/722,624, filed Dec. 20, 2012. One or more layers can be heated during or after the layer is formed in a system operable to deliver varying heat treatment or energies such as site isolated laser heating to different discrete SIRs. In some embodiments, one or more layers can also be cooled during or after the layer is formed in a system operable to control temperature of different discrete SIRs.

The conversion process may be performed in a batch system or an in-line system. In the case of an in-line system, the substrate may move through the system in a continuous manner or may move through the system in a "stop-and-soak" manner, wherein the substrate moves through various process regions of the system in a step-wise manner.

Figure 8:
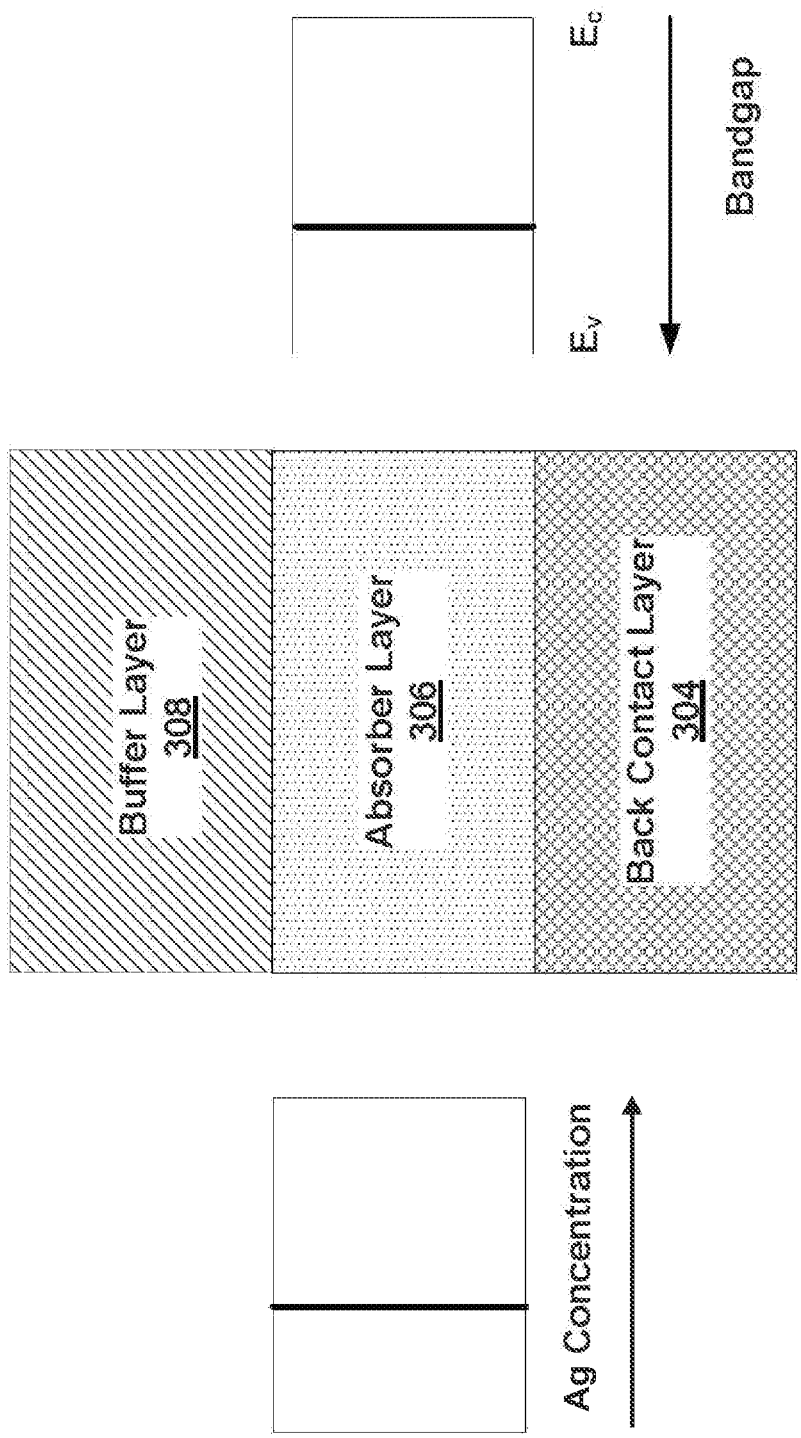
FIG. 8 illustrates an absorber layer having a flat Ag profile and a flat bandgap profile.
Figure 9:
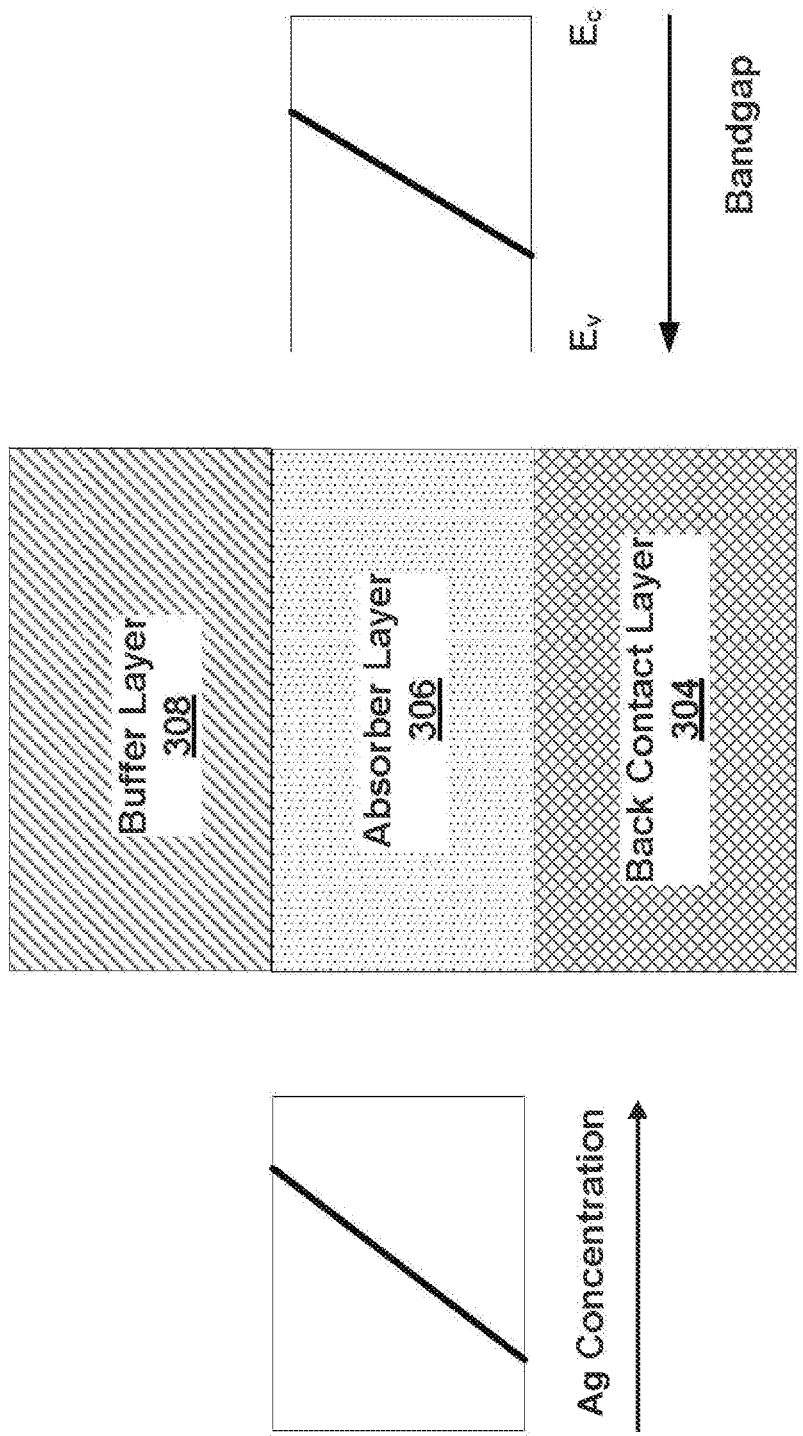
FIG. 9 illustrates an absorber layer having a single graded Ag profile and a single graded bandgap profile.
Figure 10:
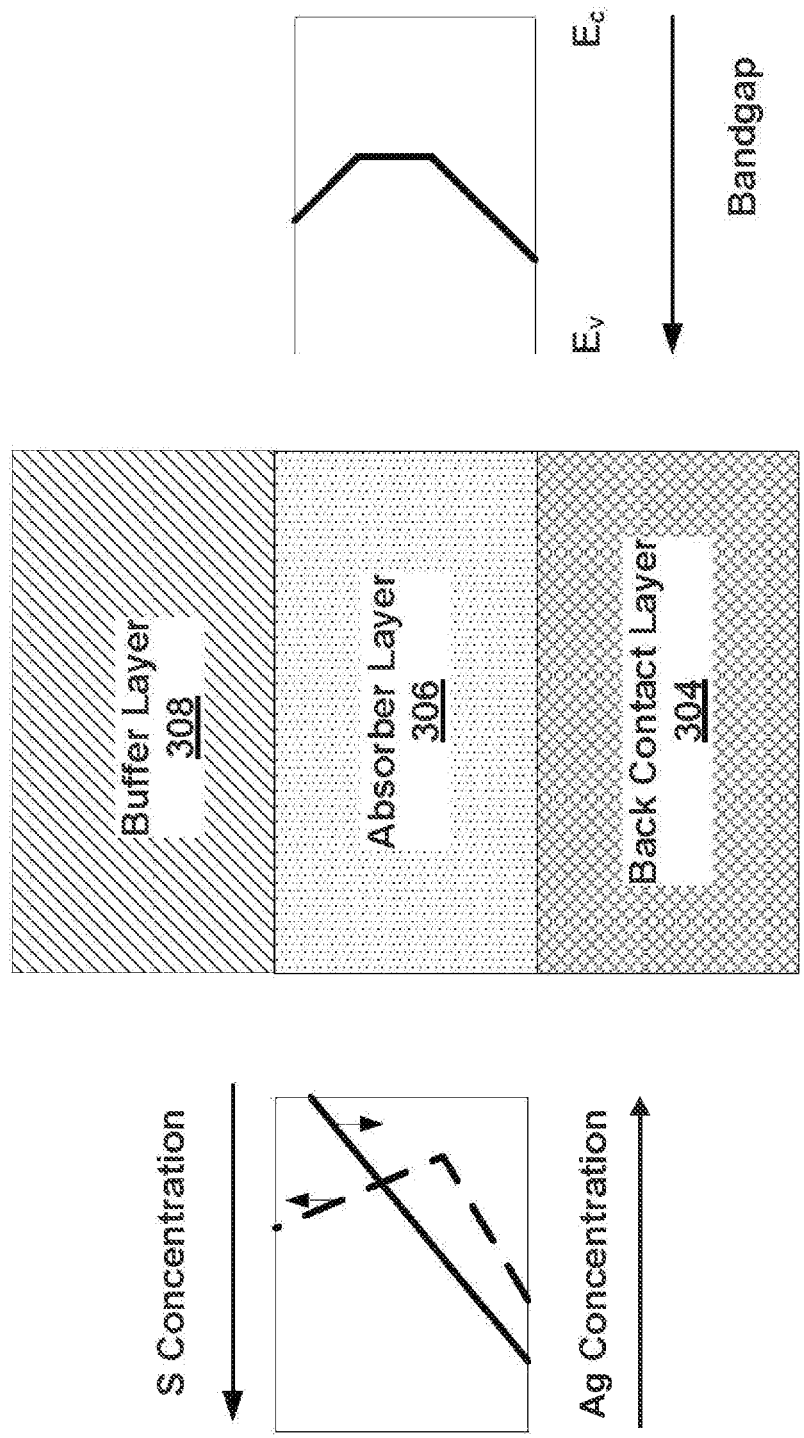
FIG. 10 illustrates an absorber layer having a single graded Ag profile, a double graded S profile, and a double graded bandgap profile.
Figure 11:
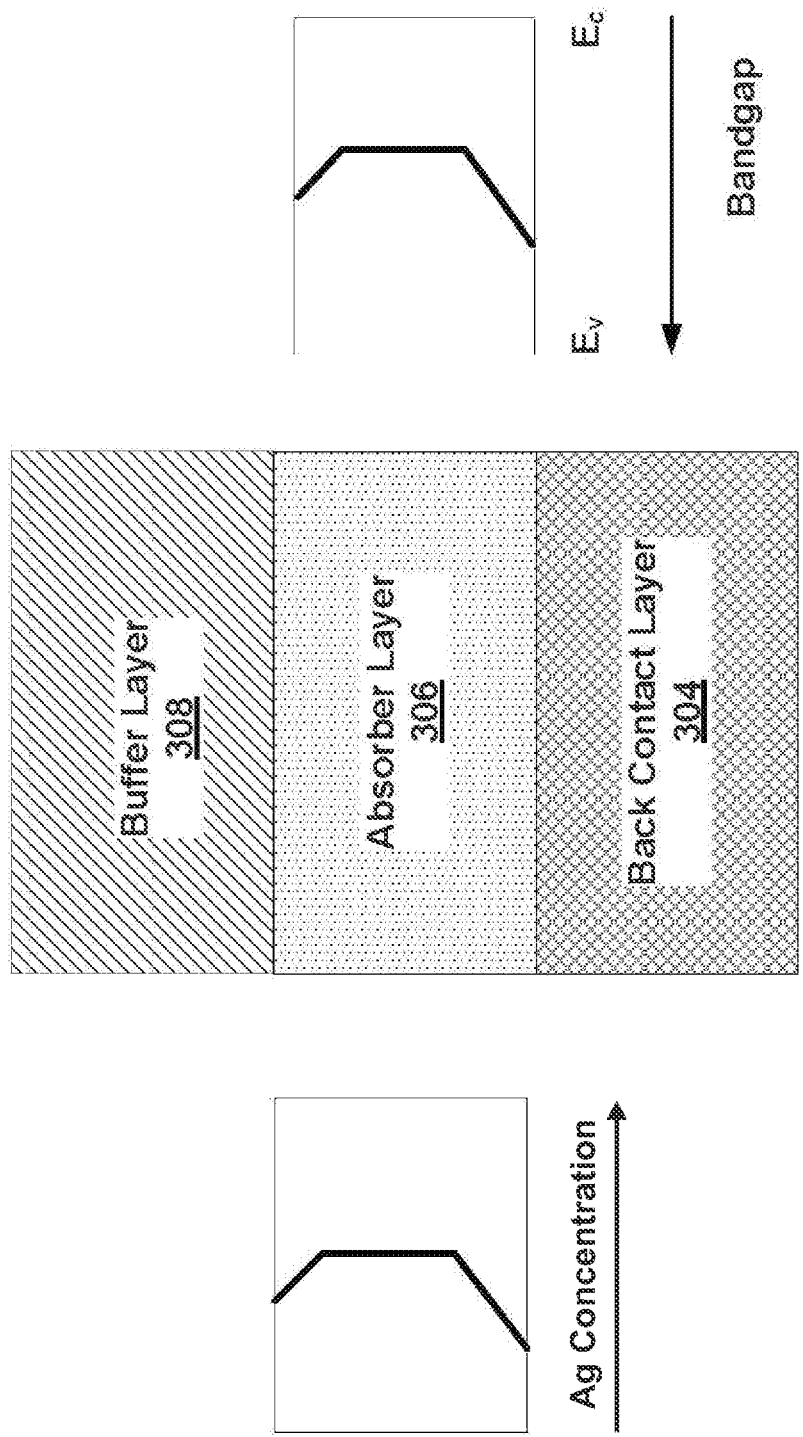
FIG. 11 illustrates an absorber layer having a double graded Ag profile and a double graded bandgap profile.

Group-IB-IIB-IVA-VIA (e.g. CZTS-based) TFPV devices can reach efficiencies beyond 10% without bandgap ($E_g$) grading (i.e., a flat $E_g$ profile). A flat bandgap is illustrated in FIG. 8. Higher efficiencies may be obtained by single grading of CZTS with a gradual decrease in Ag/(Cu+Ag) from the back contact to the front, so without a "notch" (also called saddle, or double grading). A single graded bandgap is illustrated in FIG. 9. Forming CIGS absorbers with a bandgap grading containing a "notch" (also called saddle profile or double grading) has allowed efficiencies above 18% to be realized compared to above 15% for ungraded CIGS. Bandgap grading via compositional grading, (done by Ag/(Cu+Ag), Ge/(Sn+Ge), and/or S/(S+Se)) can help in reducing interface recombination. A double graded bandgap using both Ag and S is illustrated in FIGS. 10 and 11.

Figure 12:
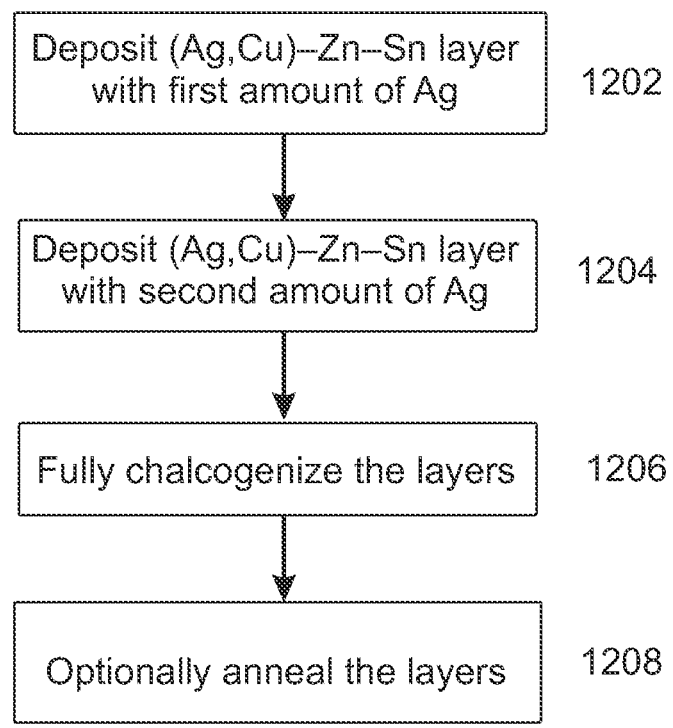
FIG. 12 sets forth a flowchart of method steps in a process sequence for forming a CZTS absorber layer, according to embodiments of the invention.

FIG. 12 sets forth a flowchart of method steps in a process sequence 1200 for forming a CZTS absorber layer, according to some embodiments of the invention. As shown in FIG. 12, method 1200 begins at step 1202, in which a first layer comprising (Ag,Cu)—Zn—Sn having a first specified amount of Ag is deposited on a substrate. In step 1204, a second layer comprising (Ag,Cu)—Zn—Sn having a second specified amount of Ag is deposited. The amount of Ag is different to provide a graded bandgap through the film thickness upon final semiconductor formation. In an alternative embodiment, the composition can be gradually varied as a single layer is deposited to prepare a continuously variable bandgap absorber.

At step 1206, the layers are chalcogenized. In some embodiments, the chalcogenizing atmosphere comprises sulfur or selenium, using sulfur-containing gases or selenium-containing gases. The sulfur-containing gas generally is hydrogen sulfide, while the selenium-containing gas generally comprises hydrogen selenide; both can be supplied at concentrations of between 0.1% to 100%. The reaction temperature can be between 300° C. and 800° C., with a pressure between 100 and 900 torr.

In an optional step, the bandgap (in addition to doping and/or recombination) can be tuned or optimized in a final anneal process. The anneal process of step 1208 can adjust the distribution of elements in the absorber layer, thereby altering the graded bandgap profile. In some embodiments, the anneal process of step 1208 is performed at a temperature greater than or equal to 500° C. It is noted that in some embodiments, depending on the reaction temperature and duration of the sulfurization or selenization process of step 1206, step 1208 may not be necessary.

Figure 13:
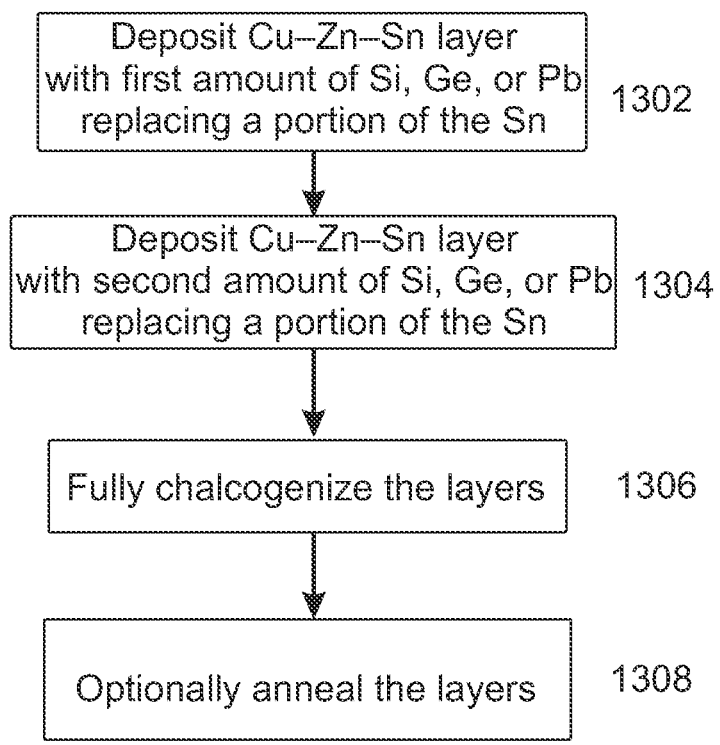
FIG. 13 sets forth a flowchart of method steps in a process sequence for forming a CZTS absorber layer, according to embodiments of the invention.

FIG. 13 sets forth a flowchart of method steps in a process sequence 1300 for forming a CZTS absorber layer, according to some embodiments of the invention. Although the method steps are described in conjunction with TFPV device 1300, persons skilled in the art will understand that formation of other TFPV devices using process sequence 1300 is within the scope of the invention. Method 1300 begins at step 1302, in which a first layer comprising Cu—Zn—(Sn, Si, Ge, Pb) having a first specified amount of Ge is deposited on a substrate. In step 1304, a second layer comprising Cu—Zn—(Sn, Si, Ge, Pb) having a second specified amount of Ge is deposited. The amount of Ge is different to provide a graded bandgap through the film thickness upon final semiconductor formation. In an alternative embodiment, the composition can be gradually varied as a single layer is deposited to prepare a continuously variable bandgap absorber.

At step 1306, the layers are chalcogenized. In some embodiments, the chalcogenizing atmosphere comprises sulfur or selenium, using sulfur-containing gases or selenium-containing gases. The sulfur-containing gas generally is hydrogen sulfide, while the selenium-containing gas generally comprises hydrogen selenide; both can be supplied at concentrations of between 0.1% to 100%. The reaction temperature can be between 300° C. and 800° C., with a pressure between 100 and 900 torr.

In step 1308, an optional anneal process can be performed on the CZTS layer. The duration and temperature at which the anneal process of step 1308 takes place may be selected to adjust bandgap profile of the absorber layer as desired. In some embodiments, the anneal process of step 1308 is performed at a temperature greater than or equal to 500° C.

Figure 14:
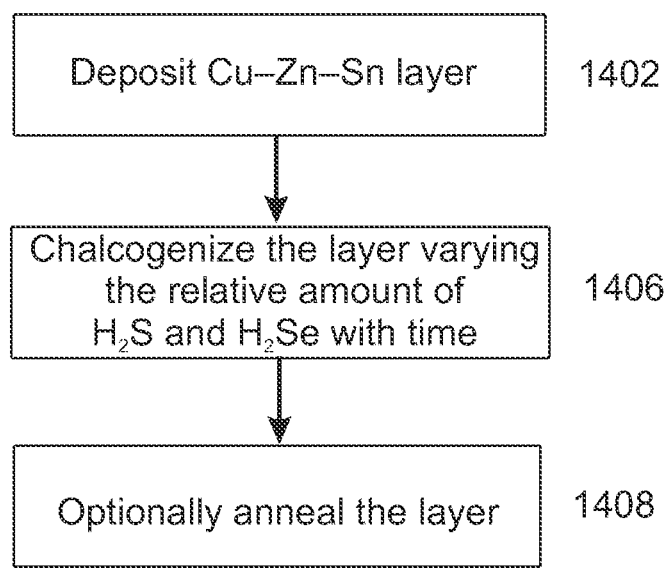
FIG. 14 sets forth a flowchart of method steps in a process sequence for forming a CZTS absorber layer, according to embodiments of the invention.

FIG. 14 sets forth a flowchart of method steps in a process sequence 1400 for forming a CZTS absorber layer, according to some embodiments of the invention. As shown in FIG. 14, method 1400 begins at step 1402, in which a first layer comprising Cu—Zn—Sn is deposited on a substrate. At step 1406, the layers are chalcogenized. In some embodiments, the chalcogenizing atmosphere comprises sulfur or selenium, using sulfur-containing gases or selenium-containing gases. The sulfur-containing gas generally comprises hydrogen sulfide, while the selenium-containing gas generally comprises hydrogen selenide; both can be supplied at concentrations of between 0.1% to 100%. The reaction temperature can be between 300° C. and 800° C., with a pressure between 100 and 900 torr. The relative amounts of hydrogen sulfide and hydrogen selenide is varied over time of treatment, providing differential sulfurization or selenization to different portions of the layer.

In step 1408, an optional anneal process can be performed on the CZTS layer. The duration and temperature at which the anneal process of step 1408 takes place may be selected to adjust bandgap profile of the absorber layer as desired. In some embodiments, the anneal process of step 1408 is performed at a temperature greater than or equal to 500° C.

Additional absorber materials comprise semiconductors comprising two or more earth abundant elements selected from O, Si, Al, Fe, Ca, Mg, Na, K, Ti, C, Mn, P, F, S, Sr, Ba, V, Cl, Cr, Zr, Ni, Zn, Cu, N, Sn, Mo, and W having a bandgap of between about 0.7 to 1.8 eV, or between about 1.0 eV and about 1.6 eV. The bandgap of the optical absorber can be graded through the thickness of the layer by partial substitution of at least one grading element from the same group in the periodic table for at least one of the two or more elements. The grading element comprises one or more of O, Si, Al, Fe, Ca, Mg, Na, K, Ti, C, Mn, P, F, S, Sr, Ba, V, Cl, Cr, Zr, Ni, Zn, Cu, N, Sn, Mo, W, Se, Ge, Pb, or Ag. In some embodiments, the bandgap is single-graded through the thickness of the layer. In some embodiments, the bandgap is double-graded through the thickness of the layer. In some embodiments, the bandgap is tuned by partial substitution of at least one grading element from the same group in the periodic table for at least one of the two or more elements.

In some embodiments, the semiconductor comprises $Cu_2SnS_3$, $Cu_2ZnSnS_4$, $WS_2$, $BaSi_2$, $Ca_3N_2$, or $Zn_3P_2$. In some embodiments, the semiconductor is $Cu_2SnS_3$ or $Cu_2ZnSnS_4$, and the at least one grading element comprises one or more of Ag, Si, Ge, Pb or Se. In some embodiments, the semiconductor is $WS_2$, and the at least one grading element comprises one or more of Mo, Cr or Se. In some embodiments, the semiconductor is $BaSi_2$, and the at least one grading element comprises one or more of Mg, Ca, Sr, Ge or Sn. In some embodiments, the semiconductor is $Ca_3N_2$, and the at least one grading element comprises one or more of Mg, Sr, Ba or P. In some embodiments, the semiconductor is $Zn_3P_2$, and the at least one grading element comprises N.

Methods of forming an optical absorber comprise forming a first layer comprising a semiconductor having a thickness and having a bandgap of between about 1.0 eV and about 1.6 eV on a substrate, and grading the bandgap through the thickness of the layer. The semiconductor comprises two or more earth abundant elements, wherein the earth abundant elements comprise O, Si, Al, Fe, Ca, Mg, Na, K, Ti, C, Mn, P, F, S, Sr, Ba, V, Cl, Cr, Zr, Ni, Zn, Cu, N, Sn, Mo, and W. The bandgap grading is performed by partially substituting at least one of the two or more earth abundant elements with a grading element. The grading element is selected from the same group in the periodic table as the at least one of the two or more earth abundant elements. In some embodiments, the at least one grading element comprises one or more of O, Si, Al, Fe, Ca, Mg, Na, K, Ti, C, Mn, P, F, S, Sr, Ba, V, Cl, Cr, Zr, Ni, Zn, Cu, N, Sn, Mo, W, Se, Ge, Pb, and Ag. Thus, a graded absorber layer can comprise a semiconductor formed from a plurality of elements, e.g., three or more elements, four or more elements, and so forth.

For example, for $Cu_2SnS_3$ and $Cu_2ZnSnS_4$, bandgap tuning and grading can be achieved by partial substitution of Ag for Cu; Si, Ge, or Pb for Sn; and Se for S. The final semiconductor layer can comprise any desired mixture of Cu, Ag, Zn, Sn, Si, Ge, Pb, S, and Se, or all of these elements. For $WS_2$, bandgap tuning and grading can be achieved by partial substitution of Mo or Cr for W and Se for S. The final semiconductor layer can comprise any desired mixture of W, Mo, Cr, Se or S. For $Ca_3N_2$, bandgap tuning and grading can be achieved by partial substitution of Mg, Sr, or Ba for Ca; and P for N. The final semiconductor layer can comprise any desired mixture of Ca, Mg, Sr, Ba, P, or N. For $Zn_3P_2$, bandgap tuning and grading can be achieved by partial substitution of N for P. The final semiconductor layer can comprise any desired mixture of Zn, N or P. For $BaSi_2$, bandgap tuning and grading can be achieved by partial substitution of Mg, Ca, or Sr for Ba; and Ge or Sn for Si. The final semiconductor layer can comprise any desired mixture of Ba, Mg, Ca, Sr, Si, Ge, Sn or Pb. With the exception of Ge, Pb and Se, all of these substitutions are earth-abundant elements. Thus, while these elements may be less available than the other possible choices, they are still reasonably available and affordable for use in smaller quantities.

In some embodiments, grading the bandgap comprises forming a second layer on the first layer, wherein the second layer comprises the same metal precursor or the same semiconductor as the first layer, and wherein the first layer has a different amount of the at least one grading element than the second layer. The first and second layers (as well as subsequent layers) can be metal precursor film(s), semiconductor, or a combination of metal and semiconductor. Additional layers can be added to provide finer control over the relative amount of the at least one grading element at various positions through the thickness. The methods can further comprise annealing the layers. The methods can further comprise converting metal precursor or semiconductor films to semiconductor layers, for example by chalcogenization, nitridization, silicidization or phosphidization.

The relative amount of the at least one grading element can also be varied continuously as deposition occurs. In some embodiments, the bandgap is single-graded through the thickness of the layer. In some embodiments, the bandgap is double-graded through the thickness of the layer. In some embodiments, the methods further comprise tuning the bandgap of the absorber by partially substituting at least one grading element from the same group in the periodic table for at least one of the two or more elements.

In some embodiments, the semiconductor is $Cu_xZn_y Sn_zS_{(4+w)(1-u)}Se_{(4+w)u}$, where $1.5 \leq x \leq 2.5$, $0.8 \leq y \leq 1.2$, $0.8 \leq z \leq 1.2$, $0 \leq u \leq 1$, $-0.2 \leq w \leq 0.5$. In some embodiments, the semiconductor is $Cu_2SnS_3$ or $Cu_2ZnSnS_4$. In the limit where the Zn content is zero, $Cu_2ZnSnS_4$ becomes $Cu_2SnS_3$, thus, $Cu_2SnS_3$ is a degenerate example of $Cu_2ZnSnS_4$. The at least one grading element comprises one or more of Ag, Si, Ge, Pb, or Se.

In some embodiments, forming the first layer (as well as subsequent layers) is performed by a method comprising sputtering from one or more of the following targets: Cu, Zn, Sn, $Cu_xS_y$, $Zn_xS_y$, $Sn_xS_y$, $Cu_xSe_y$, $Zn_xSe_y$, $Sn_xSe_y$, $Cu_xSn_yS_z$, $Cu_xSn_ySe_z$, $Cu_wSn_xS_ySe_z$, $Cu_xZn_ySn_zS_v$, $Cu_xZn_ySn_zSe_w$, or $Cu_xZn_ySn_zSe_wS_v$, where the values of x, y, z, w and v can vary. These values will be close to line compounds, solid solutions, or a mixture of line compounds, solid solutions, and the elements, as dictated by the phase diagrams. The values will be optimized to enhance ease of target manufacturing, deposition rate, and achieving the desired film composition. For example, targets comprising binary targets such as $Cu_xS_y$, e.g., $Cu_2S_1$ or $Cu_1S_1$, $Zn_xS_y$, e.g., $Zn_1S_1$, $Sn_xS_y$, e.g., $Sn_1S_1$ or $Sn_2S_3$ or $Sn_1S_2$, $Cu_xSe_y$, e.g., $Cu_2Se_1$ or $Cu_1Se_1$ or $Cu_1Se_2$, $Zn_xSe_y$, e.g., $Zn_1Se_1$, $Sn_xSe_y$, e.g., $Sn_1Se_1$, or multinary targets such as $Cu_xZn_ySn_zS_v$, e.g., $Cu_2Zn_1Sn_1S_4$, $Cu_xZn_y Sn_zSe_w$, e.g., $Cu_2Zn_1Sn_1Se_4$, or $Cu_xZn_ySn_zSe_wS_v$, e.g., $Cu_2Zn_1Sn_1Se_2S_2$, where the values of x, y, z, w and v can vary as shown, can be utilized. The sputtering can be followed by heating the layer in the presence of a chalcogen source at a temperature between 50° C. and 900° C. and a pressure between 1 torr and 900 torr. The chalcogen can be provided in the form of $H_2S$, $H_2Se$, S vapor, and/or Se vapor, at a concentration between 0.1% and 100%. The targets can have stoichiometric atomic ratios or non-stoichiometric atomic ratios. When forming $Cu_2SnS_3$, the Zn-containing targets can be omitted. Note also that some of these targets contain Se and hence contribute at least a portion of the Se used for tuning or grading or both.

In some embodiments, three elemental targets are used, one comprising Cu, one comprising Zn, and one comprising Sn. These targets can be used in an inert gas atmosphere. The targets can be used sequentially to form sets of alternating layers, or they can be used simultaneously (by co-sputtering) to form Cu—Zn—Sn metal layers of varying proportions. The layers are typically 300 nm to 900 nm in thickness with a Cu/Sn atomic ratio of 1.5:1 to 2.5:1. If no Zn is desired in the finished absorber, it can be omitted.

In some embodiments, reactive sputtering can be used where the atmosphere comprises S and/or Se (typically in the form of $H_2S$, $H_2Se$, S vapor, and/or Se vapor). The substrate temperature can be in the range 20-1000° C., typically 200-400° C. After deposition, whether in an inert or reactive atmosphere, additional sulfurization and/or selenization can be performed in a batch or inline furnace by further heating in an atmosphere containing a source of S and/or Se until no more S or Se can react with the layer. The heating can be at a temperature of 100-1000° C., typically 300-650° C. A further annealing step can be optionally added, typically in an inert (e.g., Ar) atmosphere at a higher temperature, typically 400-900° C.

In some embodiments, binary targets can be used, comprising one or more of $Cu_xS_y$, $Zn_xS_y$, $Sn_xS_y$, $Cu_xSe_y$, $Zn_xSe_y$, $Sn_xSe_y$, where the values of x and y can vary, as shown above, and the targets can have either stoichiometric atomic ratios or non-stoichiometric atomic ratios. The values if x and y will be close to line compounds, solid solutions, or a mixture of line compounds, solid solutions, and the elements, as dictated by the phase diagrams. The values will be optimized to enhance ease of target manufacturing, deposition rate, and achieving the desired film composition. These targets can be used in an inert gas atmosphere. In some embodiments, reactive sputtering can be used where the atmosphere comprises S and/or Se (typically in the form of $H_2S$, $H_2Se$, S vapor, and/or Se vapor). The substrate temperature can be in the range 20-1000° C., typically 200-400° C. After deposition, whether in an inert or reactive atmosphere, additional sulfurization and/or selenization can be performed in a batch or inline furnace by further heating in an atmosphere containing a source of S and/or Se until no more S or Se can react with the layer. The heating can be at a temperature of 100-1000° C., typically 300-650° C. A further annealing step can be optionally added, typically in an inert (e.g., Ar) atmosphere at a higher temperature, typically 400-900° C.

In some embodiments, targets can be used comprising one or more of $Cu_xZn_ySn_zS_v$, $Cu_xZn_ySn_zSe_w$, or $Cu_xZn_ySn_z Se_wS_v$, where the values of x, y, z, w and v can vary as shown above, and the value of y can be 0. These values will be close to line compounds, solid solutions, or a mixture of line compounds, solid solutions, and the elements, as dictated by the phase diagrams. The values will be optimized to enhance ease of target manufacturing, deposition rate, and achieving the desired film composition. The targets can have either stoichiometric atomic ratios or non-stoichiometric atomic ratios. While in principle, these targets can comprise substantially the same elements in the same proportions as the intended absorber layer to be deposited, the layer as deposited may not be fully sulfurized and/or selenized. Accordingly, reactive sputtering and/or additional sulfurization/selenization can be performed as described above for layers formed by sputtering from elemental and binary targets. A further annealing step can be optionally added, typically in an inert (e.g., Ar) atmosphere at a higher temperature, typically 400-900° C.

In some embodiments, methods of forming an optical absorber comprise depositing a precursor film, wherein the precursor film is poor in one or more of the elements of the final semiconductor film (optical absorber). The methods further comprise converting the precursor film to the final semiconductor (optical absorber) by adding one or more of the elements lacking in the precursor film optionally in the presence of one or more heat sources. The addition of the one or more elements lacking in the precursor film can either be by deposition of a layer, or by reaction with the atmosphere (gas or vapor).

In some embodiments, the method comprises depositing a precursor film of Cu, Ag, Sn, or Ge (e.g., by sputtering, evaporation, CVD, printing, wet coating, or plating) followed by heating in an in-line or batch oven in the presence of Se and/or S vapor to form a graded $(Cu,Ag)_2(Sn,Ge)(Se,S)_3$ film. Silver (Ag) and tin (Sn) form solid solutions in the range of 0-27 wt.-% Sn. Deposition of Sn alloyed with Ag in the range of 0-27 wt.-% Sn allows easy deposition of Sn, e.g., as a sputtered film, or as a particle in an ink. Deposition of Sn alloyed with Ag avoids the difficulties involved with deposition of elemental Sn due to its properties of being sticky and soft, resulting in nonconforming films. High-deposition-rate sputtering of conformal films of low-melting elements like Ga, In, and/or Sn is typically complicated by the limited power density that can be used for the sputtering target and the poor wetting behavior of these elements on various surfaces. Copper (Cu) and Tin (Sn) form solid solutions at about 38 wt.-% Sn and 60-61 wt.-% Sn. Deposition of Sn alloyed with Cu in those ranges allows easy deposition of Sn, e.g., as a sputtered film, or as a particle in an ink. Deposition of Sn alloyed with Cu also avoids the difficulties involved with deposition of elemental Sn. Copper (Cu) and Germanium (Ge) form solid solutions in the range of 0-27 wt.-% Ge. Deposition of Cu alloyed with Ge in the range of 0-27 wt.-% Ge allows homogeneous deposition of Cu and Ge, e.g., as a sputtered film, or as a particle in an ink. Copper (Cu) and Silicon (Si) form solid solutions in the range of 0-13 wt.-% Si. Deposition of Cu alloyed with Si in the range of 0-13 wt.-% Si allows homogeneous deposition of Cu and Si, e.g., as a sputtered film, or as a particle in an ink.

In embodiments, precursor films to form a graded $(Cu,Ag)_2(Sn,Ge)(Se,S)_3$ semiconductor film comprise a stack of sputtered layers of any sequence of one or more layers of Cu—Sn, Ag—Sn, Cu, and Cu—Ge. Part or all of the Ge and/or Si can be deposited by PECVD. It should be understood that the alloy examples are not limited to binary alloys, and homogeneous ternary or other multinary alloys can be used for homogeneous deposition of one or more layers of the precursor film as well. It should be understood that two or more of the elements Cu, Ag, Sn, Ge, Si, S, or Se might be deposited by sputtering from one or more alloy or compound targets.

In some embodiments, depositing a precursor film comprising Cu, Ag, Zn, Sn, or Ge (e.g., by sputtering, evaporation, CVD, printing, wet coating, or plating, etc.) is followed by depositing a film of elemental Se, and heating in an in-line or batch oven in the presence of $H_2S$, to form a graded $Cu_2ZnSn(S,Se)_4$ semiconductor film. Silver (Ag) and Tin (Sn) form solid solutions in the range of 0-27 wt.-% Sn. Deposition of Sn alloyed with Ag in the range of 0-27 wt.-% Sn allows easy deposition of Sn, e.g., as a sputtered film, or as a particle in an ink. Deposition of Sn alloyed with Ag avoids the difficulties involved with elemental Sn. Copper (Cu) and Tin (Sn) form solid solutions about 38 wt.-% Sn and 60-61 wt.-% Sn. Deposition of Sn alloyed with Cu in those ranges allows easy deposition of Sn, e.g., as a sputtered film, or as a particle in an ink. Deposition of Sn alloyed with Cu avoids the difficulties involved with elemental Sn. Copper (Cu) and Germanium (Ge) form solid solutions in the range of 0-27 wt.-% Ge. Deposition of Cu alloyed with Ge in the range of 0-27 wt.-% Ge allows homogeneous deposition of Cu and Ge, e.g., as a sputtered film, or as a particle in an ink. Copper (Cu) and Silicon (Si) form solid solutions in the range of 0-13 wt.-% Si. Deposition of Cu alloyed with Si in the range of 0-13 wt.-% Si allows homogeneous deposition of Cu and Si, e.g., as a sputtered film, or as a particle in an ink. Silver (Ag) and Zinc (Zn) form solid solutions in the ranges of 0-21 wt.-% Zn, 26-39 wt.-% Zn, 47-51 wt.-% Zn, and 56-81 wt.-% Zn. Deposition of Zn alloyed with Ag in these ranges allows homogeneous deposition of Ag and Zn, e.g., as a sputtered film, or as a particle in an ink. Copper (Cu) and Zinc (Zn) form solid solutions in the ranges of 0-34 wt.-% Zn, 48-52 wt.-% Zn, 59-68 wt.-% Zn, and 79-87 wt.-% Zn. Deposition of Zn alloyed with Cu in these ranges allows homogeneous deposition of Cu and Zn, e.g., as a sputtered film, or as a particle in an ink.

In some embodiments, precursor films to form a graded $Cu_2ZnSn(S,Se)_4$ semiconductor film comprise a stack of sputtered layers of any sequence of one or more layers of Cu—Sn, Ag—Sn, Cu, Cu—Zn, Ag—Zn, and Cu—Ge. Part or all of the Ge and/or Si can be deposited by PECVD. It should be understood that the alloy examples are not limited to binary alloys, and homogeneous ternary or other multinary alloys can be used for homogeneous deposition of one or more layers of the precursor film as well. It should be understood that two or more of the elements Cu, Ag, Zn, Sn, Ge, Si, S, or Se might be deposited by sputtering from one or more alloy or compound targets.

For those skilled in the art, the deposition and grading methods as described in various embodiments for $Cu_2SnS_3$, $Cu_2ZnSnS_4$, and $WS_2$ are equally applicable to these three compounds and other chalcogenides, and are within the scope of the invention.

In some embodiments, the graded semiconductor (optical absorber) is formed by (in-line) co-evaporation of the elements. In some embodiments, the graded semiconductor is formed by a 4-step method as described in U.S. patent application Ser. No. 13/595,888, filed Aug. 27, 2012, and U.S. patent application Ser. Nos. 13/596,387, 13/596,288, 13/596,344, 13/596,439, filed Aug. 28, 2012, the disclosures of which are incorporated by reference in their entireties for all purposes. In some embodiments, the graded semiconductor is formed by reactive or nonreactive sputter deposition to form a graded semiconductor film, followed by laser annealing and subsequent heating in a reactive atmosphere, as described in U.S. patent application Ser. No. 13/204,827, filed Sep. 12, 2011. In some embodiments, the graded semiconductor is formed by high-temperature, reactive sputter deposition. In some embodiments, the graded semiconductor film is formed by one or more wet coating steps (e.g., coating a substrate with an ink based on powders), a densification step (e.g., by $H_2$ anneal), and heating in a reactive atmosphere to form the final semiconductor film. In some embodiments, the graded semiconductor film is formed by one or more wet coating steps (e.g., coating a substrate with solvated species), and heating in a reactive or inert atmosphere. In some embodiments, the graded semiconductor film is formed by one or more plating steps (e.g., electroplating from solutions comprising dissolved metal species), and heating the plated substrate in a reactive atmosphere to form the final semiconductor film.

In some embodiments, deposition of W and Mo precursor films (e.g., by sputtering, evaporation, CVD, printing, wet coating, or plating, etc.) is followed by heating in an in-line or batch oven in the presence of elemental Se vapor and $H_2S$, to form a graded $WS_2$ semiconductor film. In some embodiments, precursor films to form a graded $WS_2$ semiconductor film comprise a stack of sputtered layers of any sequence of one or more layers of W and Mo. It should be understood that two or more of the elements Mo, W, Cr, S, or Se might be deposited by sputtering from one or more alloy or compound targets, for example, Cr—Mo, e.g., $Cr_{50}Mo_{50}$ or $Cr_{25}Mo_{75}$ or $Cr_{75}Mo_{25}$, Cr—W, e.g., $Cr_{50}W_{50}$ or $Cr_{25}W_{75}$ or $Cr_{75}W_{25}$, or Mo—W, e.g., $Mo_{50}W_{50}$ or $Mo_{25}W_{75}$ or $Mo_{75}W_{25}$. It should be understood that the alloy examples are not limited to binary alloys, and homogeneous ternary or other multinary alloys can be used for homogeneous deposition of one or more layers of the precursor film as well.

In some embodiments, deposition of Ba, Ca, Mg, or Sr (e.g., by sputtering, evaporation, CVD, printing, wet coating, or plating, etc.) and PECVD deposition of Si and/or Ge is followed by heating in an in-line or batch oven in the presence of gaseous species containing Si and/or Ge, to form a graded $BaSi_2$ compound. It should be understood that two or more of the elements Ba, Ca, Mg, Sr, Si, or Ge can be deposited by sputtering from one or more alloy or compound targets to form a precursor film or co-deposited to form a semiconductor film. In some embodiments, a precursor film to form a graded $BaSi_2$ semiconductor film comprises a stack of sputtered and/or PECVD layers of any sequence of one or more layers containing one or more elements from Ba, Ca, Mg, Sr, Si, or Ge.

In some embodiments, deposition of Ba, Ca, Mg, or Sr (e.g. by sputtering, evaporation, CVD, printing, wet coating, or plating, etc.) is followed by heating in an in-line or batch oven in the presence of sources of (plasma-enhanced) nitrogen (e.g., $NH_3$ or $N_2$) and/or phosphorous, to form a graded $Ca_3N_2$ compound. It should be understood that two or more of the elements Ba, Ca, Mg, Sr, N, or P might be deposited by sputtering from one or more alloy or compound targets. In some embodiments, precursor films to form a graded $Ca_3N_2$ semiconductor film comprise a stack of sputtered and/or CVD deposited layers of any sequence of one or more layers containing one or more elements from Ba, Ca, Mg, Sr, N, or P. Phosporus (P) might be introduced by P vapor or phosphine derivatives.

In some embodiments, deposition of Zn (e.g., by sputtering, evaporation, CVD, printing, wet coating, or plating, etc.) is followed by heating in an in-line or batch oven in the presence of sources of (plasma-enhanced) nitrogen (e.g., $NH_3$ or $N_2$) and/or phosphorous, to form a graded $Zn_3P_2$ semiconductor film. It should be understood that two or more of the elements Zn, N, or P might be deposited by sputtering from one or more compound targets, for example, Zn—N, Zn—P, e.g., $Zn_3P_2$ or $Zn_1P_2$ or Zn—N—P, in addition to reactive sputtering from elemental Zn in the presence of a source of N, e.g., $N_2$, and/or P, e.g., P vapor or phosphine derivatives.

In some embodiments, $BaSi_2$ is deposited by molecular beam epitaxy, by sputtering of Ba onto a silicon thin film on a substrate, or a silicon wafer, followed by interdiffusion of the Ba and Si by heat treatment. The films can be epitaxially grown, or be polycrystalline, depending on the processing conditions and method, especially maximum processing temperature. It will be understood that the deposition and grading methods as described in various embodiments for $BaSi_2$ are equally applicable to other silicides, and are within the scope of the invention.

In some embodiments, $Zn_3P_2$ is deposited by thermal evaporation, or electron beam deposition. Furthermore, $Zn_3P_2$ can be formed by deposition of Zn followed by conversion to $Zn_3P_2$ upon heating in the presence of elemental phosphorous vapor or phosphine derivatives. $Zn_3(N,P)_2$ can be formed by nonreactive sputter deposition of $Zn_3N_2$ followed by heating in the presence of phosphorous. In some embodiments, $Zn_3N_2$ can be formed by thermal decomposition of zinc diamine at elevated temperatures (>200° C.). In some embodiments, $Zn_3N_2$ can be formed by exposure of Zn to $NH_3$ at elevated temperatures (>600° C.). It will be understood that the deposition and grading methods as described in various embodiments for $Zn_3P_2$ and $Ca_3N_2$ are equally applicable to other phosphides and/or nitrides, and are within the scope of the invention.

In some embodiments, the forming is performed by sputtering from one or more of the following targets: Cu, Sn, Zn, $Cu_2SnS_3$, $Cu_2S$, or $Sn_2S$. In some embodiments, the semiconductor is $WS_2$, and the at least one grading element is one or more of Mo, Cr or Se. In some embodiments, the semiconductor is $BaSi_2$, and the at least one grading element is one or more of Mg, Ca, Sr, Ge, or Sn. In some embodiments, the semiconductor is $Ca_3N_2$, and the at least one grading element is one or more of Mg, Sr, Ba, or P. In some embodiments, the semiconductor is $Zn_3P_2$, and the grading element is N. In some embodiments, the relative amounts of the two or more elements and the at least one grading element are varied in a combinatorial manner among a plurality of discrete site-isolated regions (SIRs) designated on the substrate to prepare unique variations for testing optical absorber compositions.

In some embodiments, the relative amounts of the two or more elements and the at least one grading element are varied in a combinatorial manner among a plurality of discrete site-isolated regions (SIRs) designated on the substrate. Methods of forming an optical absorber comprise designating a plurality of discrete SIRs on a substrate, forming a semiconductor layer on the SIRS on the substrate, and characterizing each semiconductor layer formed on the discrete SIRs. The semiconductor comprises a compound of two or more elements selected from the group consisting of O, Si, Al, Fe, Ca, Mg, Na, K, Ti, C, Mn, P, F, S, Sr, Ba, V, Cl, Cr, Zr, Ni, Zn, Cu, N, Sn, Mo, W, Se, Ge, Pb, or Ag. Process parameters for forming each layer on the plurality of SIRs are varied in a combinatorial manner to prepare unique variations for testing optical absorber compositions. The methods for forming layers can vary as described above, and include dry processing methods and wet processing methods, varying process parameters appropriate to each method.

The process parameters can include process material amounts, reactant species, processing temperatures, processing times, ramp rates, cool-down rates, processing pressures, processing flow rates, processing powers, processing reagent compositions, the rates at which the reactions are quenched, atmospheres in which the processes are conducted, and order in which materials are deposited. In some embodiments, the relative amounts of the two or more elements and the at least one grading element can be varied in a combinatorial manner among the plurality of discrete SIRs designated on the substrate. In some embodiments, the characterizing each semiconductor layer comprises measuring a structure or performance parameter for each of the plurality of site-isolated regions. In some embodiments, the structure or performance parameter is one or more of crystallinity, grain size (distribution), lattice parameter, crystal orientation (distribution), matrix and minority composition, bandgap, bandgap grading, bulk bandgap, surface bandgap, efficiency, resistivity, carrier concentration, mobility, minority carrier lifetime, optical absorption coefficient, surface roughness, adhesion, thermal expansion coefficient, thickness, photoluminescence properties, surface photovoltage properties, haze, gloss, specular reflection, etc.

It will be understood that the descriptions of one or more embodiments of the present invention do not limit the various alternative, modified and equivalent embodiments which may be included within the spirit and scope of the present invention as defined by the appended claims. Furthermore, in the detailed description above, numerous specific details are set forth to provide an understanding of various embodiments of the present invention. However, one or more embodiments of the present invention may be practiced without these specific details. In other instances, well known methods, procedures, and components have not been described in detail so as not to unnecessarily obscure aspects of the present embodiments.

What is claimed is:

1. An optical absorber comprising
a semiconductor layer having a thickness and having a bandgap of between about 1.0 eV and about 1.6 eV on a substrate,
wherein the semiconductor comprises two or more earth abundant elements, and wherein the semiconductor comprises Ca and N; and
wherein the bandgap is graded through the thickness of the layer by partial substitution of at least one of the two or more earth abundant elements by a grading element,
wherein the grading element comprises one or more of Mg, Sr, Ba or P.

2. The optical absorber of claim 1, wherein the bandgap is single-graded through the thickness of the layer.

3. The optical absorber of claim 1, wherein the bandgap is double-graded through the thickness of the layer.

4. A method of forming an optical absorber comprising
forming a first layer having a thickness and comprising a semiconductor having a bandgap of between about 1.0 eV and about 1.6 eV on a substrate, and
grading the bandgap through the thickness of the layer,
wherein the semiconductor comprises two or more earth abundant elements, and
wherein the bandgap grading is performed by partially substituting at least one grading element for at least one of the two or more earth abundant elements,
wherein the grading element is from the same group in the periodic table as the at least one of the two or more earth abundant elements,
wherein grading the bandgap comprises forming a second layer above the first layer, wherein the second layer comprises the same semiconductor as the first layer, and wherein the first layer has a different amount of the at least one grading element than the second layer.

5. The method of claim 4, wherein forming the first layer comprises
forming a precursor film comprising one or more earth abundant elements on a substrate, and converting the precursor film to a semiconductor.

6. The method of claim 4, wherein the at least one grading element comprises one or more of O, Si, Al, Fe, Ca, Mg, Na, K, Ti, C, Mn, P, F, S, Sr, Ba, V, Cl, Cr, Zr, Ni, Zn, Cu, N, Sn, Mo, W, Se, Ge, Pb, and Ag.

7. The method of claim 4, further comprising annealing the first and second layers.

8. The method of claim 4, wherein grading the bandgap provides an absorber layer that is single-graded through the thickness of the layer.

9. The method of claim 4, wherein grading the bandgap provides an absorber layer that is double-graded through the thickness of the layer.

* * * * *